United States Patent
Chikahisa et al.

(10) Patent No.: US 7,712,432 B2
(45) Date of Patent: May 11, 2010

(54) PRINTING APPARATUS AND METHOD FOR BONDING MATERIAL

(75) Inventors: Naoichi Chikahisa, Mino (JP); Hiroshi Yamauchi, Katano (JP); Jun Shirai, Toyonaka (JP); Toshiaki Yamauchi, Yawata (JP); Yoshiyuki Fujita, Niihama (JP); Masanori Iwasaki, Higashiosaka (JP)

(73) Assignee: Panasonic Corporation, Osaka (JP)

( * ) Notice: Subject to any disclaimer, the term of this patent is extended or adjusted under 35 U.S.C. 154(b) by 1067 days.

(21) Appl. No.: 10/969,867

(22) Filed: Oct. 22, 2004

(65) Prior Publication Data
US 2005/0196531 A1 Sep. 8, 2005

(30) Foreign Application Priority Data
Mar. 5, 2004 (JP) ............... 2004-061772

(51) Int. Cl.
*B41M 1/12* (2006.01)
*C23C 14/50* (2006.01)
*B05C 1/00* (2006.01)

(52) U.S. Cl. .................. 118/213; 118/50; 101/129; 101/127.1

(58) Field of Classification Search .......... None
See application file for complete search history.

(56) References Cited

U.S. PATENT DOCUMENTS 6,532,155 B2 * 3/2003 Green et al. ............. 361/733

FOREIGN PATENT DOCUMENTS

| JP | 63-117491 | | 5/1988 |
| JP | 03-093543 | | 4/1991 |
| JP | 4-97587 | | 3/1992 |
| JP | 04097587 A | * | 3/1992 |
| JP | 04-102387 | | 4/1992 |
| JP | 04-168799 | | 6/1992 |
| JP | 05-185580 | | 7/1993 |
| JP | 08241919 A | * | 9/1996 |
| JP | 10-163697 | | 6/1998 |
| JP | 2000308845 A | * | 11/2000 |
| JP | 2002-335098 | | 11/2002 |
| JP | 2003-142898 | | 5/2003 |
| JP | 2003-258419 | | 9/2003 |

\* cited by examiner

*Primary Examiner*—Frederick J Parker
*Assistant Examiner*—Cachet I Sellman
(74) *Attorney, Agent, or Firm*—Wenderoth, Lind & Ponack, L.L.P.

(57) ABSTRACT

In printing of a bonding material in which a board is supported from a component mounting-side surface on which a plurality of components are mounted, and a bonding material is printed on a working-side surface which is a surface opposed to the component mounting-side surface of the board, an edge portion region of the board supported by a board transporting unit is included in a support region of the board during the printing so as to enlarge the support region of the board having the components mounted thereon in high density and to achieve reliable and high precision printing of the bonding material.

18 Claims, 23 Drawing Sheets

PRINTING APPARATUS AND METHOD FOR BONDING MATERIAL

BACKGROUND OF THE INVENTION

The present invention relates to a printing apparatus and method for a bonding material, in which a board is supported from its component mounting-side surface on which a plurality of components are mounted while a bonding material of components is printed on its working surface that is a surface opposed to the component mounting-side surface of the board.

Higher integration is required from electronic circuits, which are formed by mounting a plurality of components or electronic components on a board, as electronic equipment incorporating such electronic circuits has higher performance and smaller size. Accordingly, in recent years, in order to make efficient use of the surface area of the board, the electronic components are mounted on both sides of the board, i.e., double-sided mounting is performed (see, e.g., Japanese unexamined patent publication No. H04-97587 or No. 2003-258419).

Moreover, such mounting of the electronic components is generally achieved by a hot-air reflow method which is composed of the steps of: printing a solder paste, which is a bonding material, at component mounting positions on a board (printed circuit board); then disposing electronic components on the component mounting positions; and melting the solder paste by such means as blowing hot air to the entire board so as to conduct soldering.

Moreover, in the case where the double-sided mounting is performed, one side of the board has respective electronic components mounted thereon through the steps of: printing a solder paste on the side of the board by means of screen printing and the like; disposing respective electronic components through the solder paste; and reflowing, after which the other side has respective electronic components mounted thereon through the same procedures.

A description is herein given of the procedures of a conventional method for feeding a solder paste to the other side when such double-sided mounting is performed, i.e., the procedures of a conventional screen printing method, with reference to schematic explanatory views in FIGS. 22A, 22B and 22C.

First, FIG. 22A shows a board 502 with electronic components 501 mounted on its one surface in the state of being transported to a printing position while the one surface faces down and opposite end portions on the one surface are supported by belt conveyer transportation rails 503a and 503b.

After that, as shown in FIG. 22B, at the printing position A, a support block 504 for supporting the lower surface of the board 502 so as to support the board 502 is on standby, while above the support block 504, a screen 506 whose periphery is supported by a screen frame 505 is also on standby. In this state, at the printing position A, the board 502 supported by the respective transportation rails 503a and 503b are transported in between the screen 506 and the support block 504.

Upon this transportation, as shown in FIG. 22C, the support block 504 is elevated so that the support block 504 supports the lower surface of the board 502 and the supported board 502 is lifted. The lifted board 502 is brought into the state that its upper surface is in contact with a plate surface portion of the screen 506, after which elevation of the support block 504 is stopped and the contact state is retained. It is to be noted that although the lower surface of the board 502 has a plurality of the electronic components 501 mounted thereon, a recess portion 550 is formed on the upper surface of the support block 504 depending on the mounting position and shape of the respective electronic components 501, thereby allowing reliable support of the board 502 by the support block 504.

After that, as show in FIG. 22C, the upper surface of the screen 506 which is in contact with the upper surface of the board 502 is scrabbled by a squeegee unit 507 so that a solder paste 508 is fed to the board 502 through the screen 506, by which printing of the solder paste is conducted.

Herein, a schematic plane view of the one surface (i.e., the lower surface) of the board 502 is shown in FIG. 23. As shown in FIG. 23, the board 502 is in an almost square shape, and along the inner outline of the almost square shape, slit-like-hole portions 509 are formed. The slit-like-hole portions 509 are formed so that after completion of mounting of the electronic components 501, a plurality of slim connecting portions 512 which connect an internal component portion 510 and an outline portion 511 (generally referred to as an edge portion) are formed to make it easy for the product portion 510 (electronic circuit) to be cut off and separated from the outline portion 511. It is to be noted that the region surrounded with the respective slit-like-hole portions 509 is a component mounting region (product portion 510), on which a plurality of the electronic components 501 are mounted.

Moreover, as shown in FIG. 23, respective edge portion regions 513a, 513b in the vertical direction in the drawing are the regions supported by the belt conveyer transportation rails 503a and 503b shown in FIG. 22A. The support block 504 can support the board 502 in the regions other than these edge portion regions 513a, 513b, and a width dimension W1 of the support block 504 is a dimension obtained by subtracting width dimensions of the respective edge portion regions 513a, 513b from a width dimension W2 of the board 502.

In recent years, high-density mounting of the electronic components 501 on the board 502 is more and more progressing, along with which the number of the electronic components 501 mounted on the board 502 increases and the shape and size of the respective electronic components 501 to be mounted becomes of great variety. Further, the support block 504 having the above-described structure is required to have the recess portion 550 depending on the shape and size of the respective electronic components 501, which increases the forming places of support faces 551 for supporting respective non-mounting regions 514a, 514b, 514c in the board 502. However, in the case where operations such as the screen printing are reliably performed, while it is necessary to maintain the board 502 to a near-horizontal position, forming the recess portion 550 and a plurality of the support faces 551 having the size and shape in such variety on the support block 504 makes it more difficult to maintain the board 502 to a near-horizontal position in terms of its processing precision and the like.

Further, there is a support block in which, for reliable retention of the board 502, suction holes are formed on the respective (or any) support faces 551 of the support block 504 and the supported board 502 is sucked through the suction holes so that the board 502 is sucked and held by the support faces 551. Further, in response to demands for high-density mounting which exhibits more and more progress in recent years, the number of the respective electronic components 501 to be mounted on the board 502 or its mounting density are increasing, so that the area of the non-mounting regions 514a, 514b and 514c, which are the regions for supporting the board 502 in the state of being in contact with the board 502, is on the considerable decrease. Under these circumstances, it becomes difficult to form the suction holes on the respective support faces 551, which in turn makes it difficult to reliably suck and retain the supported board 502.

Moreover, in order to respond to retention of the board 502 having a variety of electronic components 501 mounted thereon, there has been devised a method for supporting the board 502 with the support block, in which a soft layer is formed on the upper face (support face) of the support block, and the electronic components 501 in contact with the soft layer are supported by deforming the soft layer. However, such a method is effective when all the electronic components 501 to be mounted are relatively small in thickness to the extent that the soft layer can be sufficiently deformed. Therefore, in the case where the respective electronic components 501 are varied in thickness, i.e., in the case where some electronic components 501 are larger in thickness than other electronic components 501, the soft layer cannot be sufficiently deformed, thereby causing a problem in that reliable support of the board 502 cannot be achieved.

Further, in the board 502 whose one side already has components mounted thereon, thermal hysteresis caused by the loading of the components often generate warpage on the board 502 as shown in a virtual line in FIG. 22A, and further in the case where a fewer number of the suction points are left on the product portion 510, there is a problem in that warpage straightening and retaining effects on the board 502, which are obtained by sucking and holding the board 502 so as to bring the board 502 in close contact with the support faces 551 on the support block 504, cannot be expected.

Moreover, even in the case where the warpage straightening and retention effects by the support block 504 can be obtained, if an adhesion force between the screen 506 and the upper surface of the board 502 is too large to achieve sufficient screen release when the support block 504 is lowered and the board 502 is separated (released) from the screen 506 after printing, the screen 506 is gradually separated from the board 502 while partially being stretched downward as shown in FIG. 24. In such a case, at the time when a portion which sticks to the screen 506 till the last is separated from the board 502, the screen 506 vibrates in the vertical direction due to the action of the separation, which may cause printing results to have bleeding and dropout failures, thereby hindering high-precision printing.

SUMMARY OF THE INVENTION

Accordingly, in order to solve the above-stated problems, an object of the present invention is to provide a printing apparatus and method for a bonding material for use in printing of the bonding material in which the board is supported from its component mounting-side surface having a plurality of components mounted thereon and the bonding material is printed on the supported board, the printing apparatus and method allowing a board to be reliably sucked and held so as to achieve reliable and high-precision printing of the bonding material even if a variety of the components are mounted on the board in high density.

In order to accomplish the above object, the present invention is constituted as shown below.

According to a first aspect of the present invention, there is provided a printing method for a bonding material, in which a board is supported from a component mounting-side surface on which a plurality of components are mounted, and a bonding material of components is printed on a working-side surface which is a surface opposed to the component mounting-side surface of the board, comprising:

transporting the board into a printing processing region in a state, while at least an edge portion on the component mounting-side surface of the board is supported by a board transporting unit;

retaining a supported posture of the board by releasing the support of the board by the board transporting unit while sucking and holding a region including at least the edge portion on the component mounting-side surface of the board in the printing processing region; and printing the bonding material on the working-side surface on the board in a state that the supported posture is retained.

According to a second aspect of the present invention, there is provided the printing method for a bonding material as defined in the first aspect, wherein the edge portion on the component mounting-side surface with sucking the edge portion is supported, while avoiding a contact with the respective components mounted on the component mounting-side surface;

at the same time, the supported posture of the board is retained, by supporting a non-mounting region of the respective components in a vicinity of a near center of the component mounting-side surface to supplement support of the board, while sucking surfaces of the components mounted on the component mounting-side surface to supplement suction of the board; and the bonding material is printed in the retention state.

According to a third aspect of the present invention, there is provided the printing method for a bonding material as defined in the first aspect, wherein after the retention of the board is performed, a plate surface portion of a screen is brought into contact with the working-side surface of the board in the retention state, while bringing the plate surface portion into close contact with the working-side surface of the board by sucking and holding a board-side surface of the screen in a vicinity of a periphery of the plate surface portion by a screen retaining device, and in printing of the bonding material, the bonding material is printed on the working-side surface of the board through the plate surface portion of the screen in the close contact state.

According to a fourth aspect of the present invention, there is provided the printing method for a bonding material as defined in the first aspect, wherein after printing of the bonding material is performed, the working-side surface of the board is separated from the plate surface portion in a state that the screen is sucked and held by the screen retaining device.

According to a fifth aspect of the present invention, there is provided the printing method for a bonding material as defined in the first aspect, wherein the supported posture of the board is retained by pressing a warpage straightening member of the board to the working-side surface of the board to straighten a warpage and retaining the straightened support posture by sucking and holding at least the edge portion on the component mounting-side surface of the board.

According to a sixth aspect of a present invention, there is provided a printing apparatus for a bonding material, in which a board is supported from a component mounting-side surface on which a plurality of components are mounted, and a bonding material of components is printed on a working-side surface which is a surface opposed to the component mounting-side surface of the board, comprising:

a board transporting unit for supporting, in a releasable manner, at least an edge portion on the component mounting-side surface of the board and transporting the board in a state of being supported to a printing processing region;

a board retaining device capable of sucking and holding the board which was transported to the printing processing region by the board transporting unit and was released from the support, in a region including at least the edge portion on the component mounting-side surface, so as to retain a supported posture of the board by sucking and holding; and a bonding material printing unit for printing the bonding material on the working-side surface of the board which is in a state that the supported posture is retained by the board retaining device.

According to a seventh aspect of the present invention, there is provided the printing apparatus for a bonding material as defined in the sixth, wherein the board transporting unit comprises:

a pair of transportation support members for supporting the edge portions opposed to each other on the board; and a support member moving unit for moving a pair of the transportation support members forward and backward between a support position for supporting the board and a support release position for releasing the support, and the board retaining device supports a region including the edge portions released from the support by positioning a pair of the transportation support members at the support release position by the support member moving unit.

According to an eighth aspect of the present invention, there is provided the printing apparatus for a bonding material as defined in the sixth aspect, wherein the bonding material printing unit comprises:

a screen which is adopted to be placed on the working-side surface of the board and which has a plate surface portion congruent with a printing position of the bonding material on the working-side surface;

a printing unit for printing the bonding material on the working-side surface through the plate surface portion by feeding the bonding material while moving along the screen placed on the working-side surface; and a screen retaining device placed adjacent to the board retaining device, for bring the plate surface portion into close contact with the working-side surface by sucking and holding a vicinity of a periphery of the plate surface portion on a board-side surface of the screen placed on the working-side surface of the board, and the bonding material printing unit prints the bonding material in a state that the plate surface portion of the screen is in close contact with the working-side surface of the board by the screen retaining device.

According to a ninth aspect of the present invention, there is provided the printing apparatus for a bonding material as defined in the eight aspect, wherein the board retaining device comprises:

a board retaining block which is in contact with a region including the edge portion of the board, for sucking and holding the board in a state of being in contact; and an elevating unit for elevating and lowering the board retaining block, which makes the screen place on the working-side surface of the sucked and held board by elevating the board retaining block, and makes the screen release the disposition by lowering the board retaining block, the elevating unit releases the disposition by lowering the board together with the board retaining block in a state that the screen is sucked and held by the screen retaining device so as to separate the screen and the board.

According to a tenth aspect of the present invention, there is provided the printing apparatus for a bonding material as defined in the sixth aspect, wherein the board retaining device comprises:

a board retaining block including a board edge retaining member which has a support face for supporting the edge portion by coming into contact with the edge portion on the component mounting-side surface of the board and a suction hole formed on the support face for sucking the edge portion in the contact state and which retains the board by supporting and sucking the edge portion, the board retaining block forming a contact avoiding space mostly surrounded with the board edge support member so as to be avoid contact with the component mounting-side surface and the respective components mounted on the component mounting-side surface;

a board support member fixed on the board retaining block in the contact avoiding space for supporting a non-mounting region by coming into contact with the non-mounting region of the respective components in a vicinity of a near center of the component mounting-side surface;

a component suction member fixed on the board retaining block in a vicinity of the board support member in the contact avoiding space for sucking surfaces of the components mounted on the component mounting-side surface; and a suction unit connected so as to be communicated with the suction hole of the board edge retaining member and the component suction member for performing sucking for respective sucking operations.

According to an eleventh aspect of the present invention, there is provided the printing apparatus for a bonding material as defined in the tenth aspect, wherein the board support member is a support auxiliary dedicated member which supports the non-mounting region so as to supplement a function to support the board by the board edge retaining member, and the component suction member is a suction auxiliary dedicated member which sucks the components so as to supplement a function to suck the board by the board edge retaining member.

According to a twelfth aspect of the present invention, there is provided the printing apparatus for a bonding material as defined in the eleventh aspect, wherein the board support member supports the non-mounting region so as to regulate a height position to retain the components by the component suction member.

According to a thirteenth aspect of the present invention, there is provided the printing apparatus for a bonding material as defined in the tenth aspect, wherein the support face of the board edge retaining member has a first cushion member, and a suction end of the component suction member has a second cushion member lower in hardness than the first cushion member.

According to a fourteenth aspect of the present invention, there is provided the printing apparatus for a bonding material as defined in the tenth aspect, wherein the component suction member comprises a plurality of members for separately sucking a plurality of the components mounted on the component mounting-side surface, and in the respective component suction members, height positions of suction ends are determined according to height positions of suction target faces of the components to be sucked.

According to a fifteenth aspect of the present invention, there is provided the printing apparatus for a bonding material as defined in the tenth aspect, wherein the suction hole possessed by the board edge retaining member has a groove-shaped aperture formed along the edge portion.

According to a sixteenth aspect of the present invention, there is provided the printing apparatus for a bonding material as defined in the thirteenth aspect, wherein the component suction member is a suction pad portion having, as the second cushion member, the suction end formed from a rubber material which can be elastic-deformed by contact with the components in response to mounting position displacement of the components on the suction target face.

According to a seventeenth aspect of the present invention, there is provided the printing apparatus for a bonding material as defined in the tenth aspect, wherein in the board edge retaining member, the support face has a protruding support face which partially protrudes in a direction along the component mounting-side surface and also in a direction almost orthogonal to a direction along the edge portion of the board, and which supports an inside region adjacent to the edge portion on the component mounting-side surface by coming into contact with the region.

According to the present invention, when the board is supported by the board transporting unit and is loaded into the printing operation region so that a bonding material is screen printed on the working-side surface of the board, the board which reached the printing operation region is separated from the board transporting unit and the board transporting unit is retreated, while a region including at least the edge portion of the board on the component mounting-side surface of the board, i.e., a region including the region supported by the board transporting unit is sucked and held so that the board is retained while the supported posture of the board is straightened, and further by feeding the bonding material to the working-side surface of the board in the state that the supported posture is straightened and retained, a sucked and held region can be increased compared to conventional printing of bonding materials even if the board has components mounted thereon in high density. This allows the supported posture of the board to be straightened while the board is reliably retained, making it possible to realize reliable and high-precision printing.

Further, in the board retaining device, in addition to the board edge retaining member for supporting and sucking the edge portion of the component mounting-side surface of the board so as to retain the board, there are provided the board support member for supporting the non-mounting region placed in the vicinity of the near center on the component mounting-side surface of the board so as to supplement the support of the board by the board edge retaining member, and the component suction member for sucking the board through the components by sucking the surface of the components mounted in the vicinity of the non-mounting region so as to supplement the suction of the board by the board edge retaining member. This allows the component mounting-side surface of the board having the respective components mounted thereon in high density to be reliably supported and allows the supported posture to be retained, thereby achieving reliable retention of the board.

Particularly, in the case where the respective components are mounted in high density, an area of the edge portion, which is a region free from the respective components mounted on the component mounting-side surface of the board, itself becomes smaller, and therefore support and suction of the edge portion by the board edge retaining member are not enough to achieve reliable and sufficient retention of the board. Accordingly, in the inside region surrounded with the edge portion, the support and suction are performed by the board support member and the component suction member, which makes it possible to supplement the support and suction by the board edge retaining member and achieve reliable retention of the board.

More specifically, in the case where the respective components are mounted in high density in particular, the region surrounded with the edge portion on the component mounting-side surface of the board has considerably less region which can be supported by the contact (i.e., the non-mounting region). However, even in such a case, the board support member is provided with only the support function by the contact and not with the suction function, so that the surface area of the support face of the board support member can be decreased and the support can be ensured.

Further, the suction function not provided to the board support member is compensated by being given to the component suction member instead of the board support member. More particularly, sucking the surfaces of the products by the component suction member allows suction and retention of the board through the components.

Therefore, in the board, suction and retention is achieved by the board edge retaining member supporting and sucking the edge portion not having the respective components mounted thereon, while a deficiency in support and suction by the board edge retaining member is covered by the support function and suction function which are separately provided to the board support member and the component suction member, thereby allowing reliable retention of the board to be achieved.

Therefore, the board, both sides of which have components mounted thereon in high density can be reliably sucked and held with its component mounting-side surface serving as the support-side surface, and in the sucked and held state, specified operations can be surely applied to the working-side surface of the board.

Further, since the board support member is a support auxiliary dedicated member for supplementing the function to support the board by the board edge retaining member, while the component suction member is a suction auxiliary dedicated member for supplementing the function to suck the board by the board edge retaining member, the above effects can be definitely achieved.

Further, the board support member regulates the height positions to retain the components by suction of the component suction member, so that warp in the vicinity of the near center of the board can be suppressed through the components, and the board can be retained while keeping the near horizontal position.

Further, a cushion member is provided to the support face of the board edge retaining member which sucks and holds the board or the components in the state of being in contact with the surface of the board or the components as well as to the suction end of the component suction member, so that with use of elasticity of the cushion member, close contact can be secured so as to achieve reliable suction and retention. Further, since the component suction member which is required to have not the support function but the suction function is provided with the second cushion member which is lower in hardness than the cushion member (first cushion member) provided to the board edge retaining member, the suction function can be enhanced. Moreover, providing the second cushion member makes it possible to prevent damages on the products to be sucked and held from occurring, and to flexibly absorb displacement of suction and retention position due to displacement of mounting positions of the products.

Further, in the case where a plurality of the component suction members are provided for separately sucking a plurality of the components mounted on the component mounting-side surface, the height positions of the suction ends in the respective component suction members are determined according to the height positions of the suction target faces of the products to be sucked, so that suction and holding of the respective components can be achieved reliably and excellently.

Further, the suction hole included in the board edge retaining member has an almost groove-shaped aperture formed along the edge portion, so that in the support face of the board edge retaining member, the area of the aperture can be enlarged, thereby making it possible to suck and hold the edge portion in contact with the support face with a high suction force.

Further, the second cushion member forming the suction end of the component suction member is a rubber material which allows elastic deformation upon contact in response to the mounting position displacement on the suction target faces of the components to be sucked and held, which allows the suction function of the component suction member to be implemented more reliably.

Further, in the support face of the board edge retaining member, there is provided a protruding support face for supporting the inner region which is surrounded with the edge portion and is adjacent to the edge portion, which makes it possible to prevent a portion equivalent to the inner region surrounded with the edge portion from being warped. Therefore, it becomes possible to achieve reliable retention of the board while keeping the board to a near horizontal position.

BRIEF DESCRIPTION OF THE DRAWINGS

These and other aspects and features of the present invention will become clear from the following description taken in conjunction with the preferred embodiments thereof with reference to the accompanying drawings, in which:

FIGS. 13A and 13B are schematic explanatory views explaining the release operation between the screen and the board in the first embodiment, in which FIG. 13A is a view showing the state where the screen and the board are in close contact, and FIG. 13B is a view showing the state where the release operation is performed;

FIG. 14A is a schematic explanatory view showing the state immediately after a squeegee passed a section on the screen corresponding to the board in the printing method of the first embodiment, while

FIGS. 22A, 22B and 22C are schematic explanatory views each showing a conventional method for feeding a solder paste to a board, in which FIG. 22A is a view showing the state where the board is transported to a printing position, FIG. 22B is a view showing the state where the board is positioned between the screen and the support block at the printing position, and FIG. 22C is a view showing the state where printing is performed by a squeegee unit;

DETAILED DESCRIPTION OF THE PREFERRED EMBODIMENTS

Figure 1:
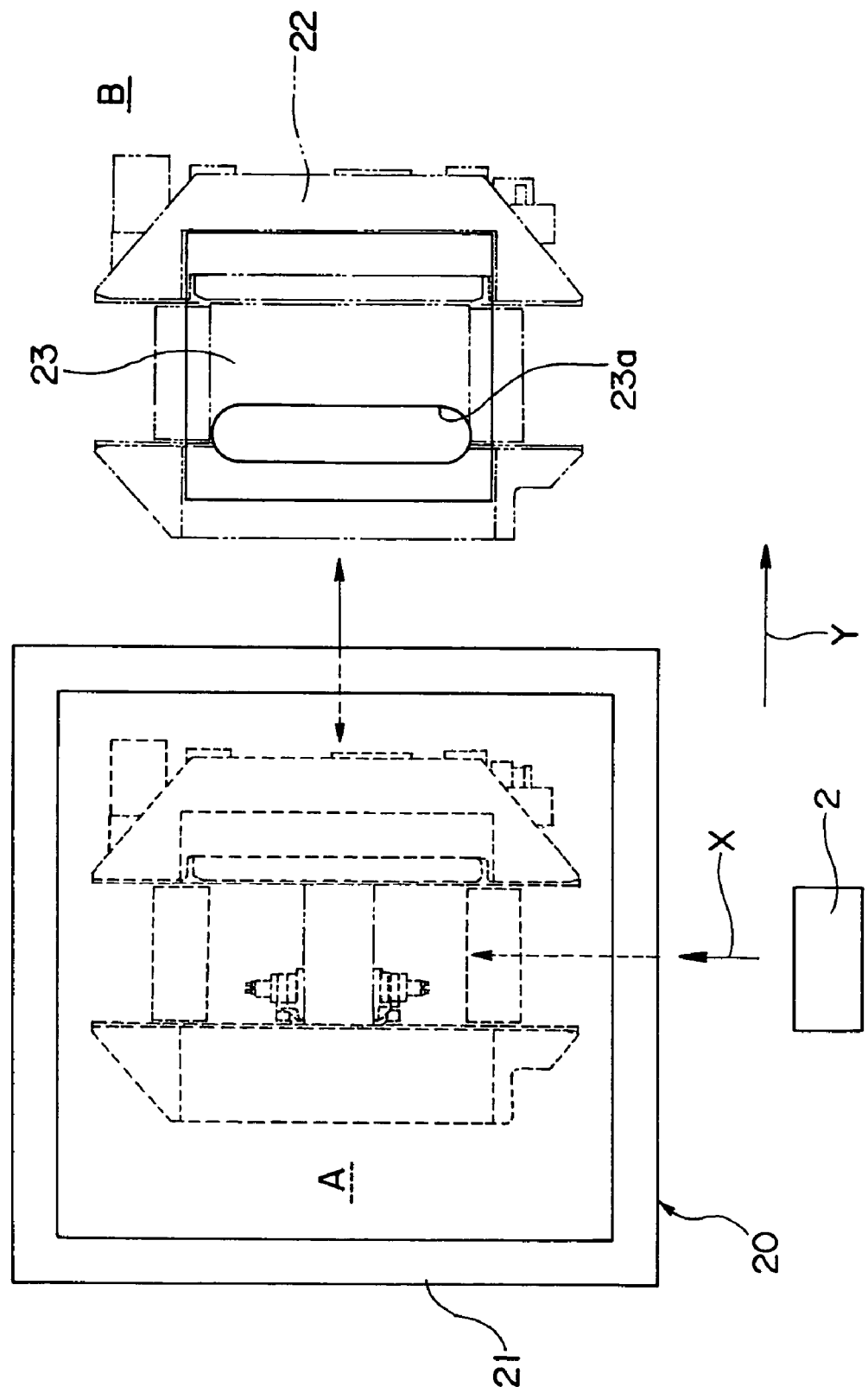
FIG. 1 is a plane view showing a primary part of a screen printing apparatus in a first embodiment of the present invention.

Before the description of the present invention proceeds, it is to be noted that like parts are designated by like reference numerals throughout the accompanying drawings.

First Embodiment

Hereinbelow, the first embodiment of the present invention is described in detail with reference to the drawings.

Figure 2:
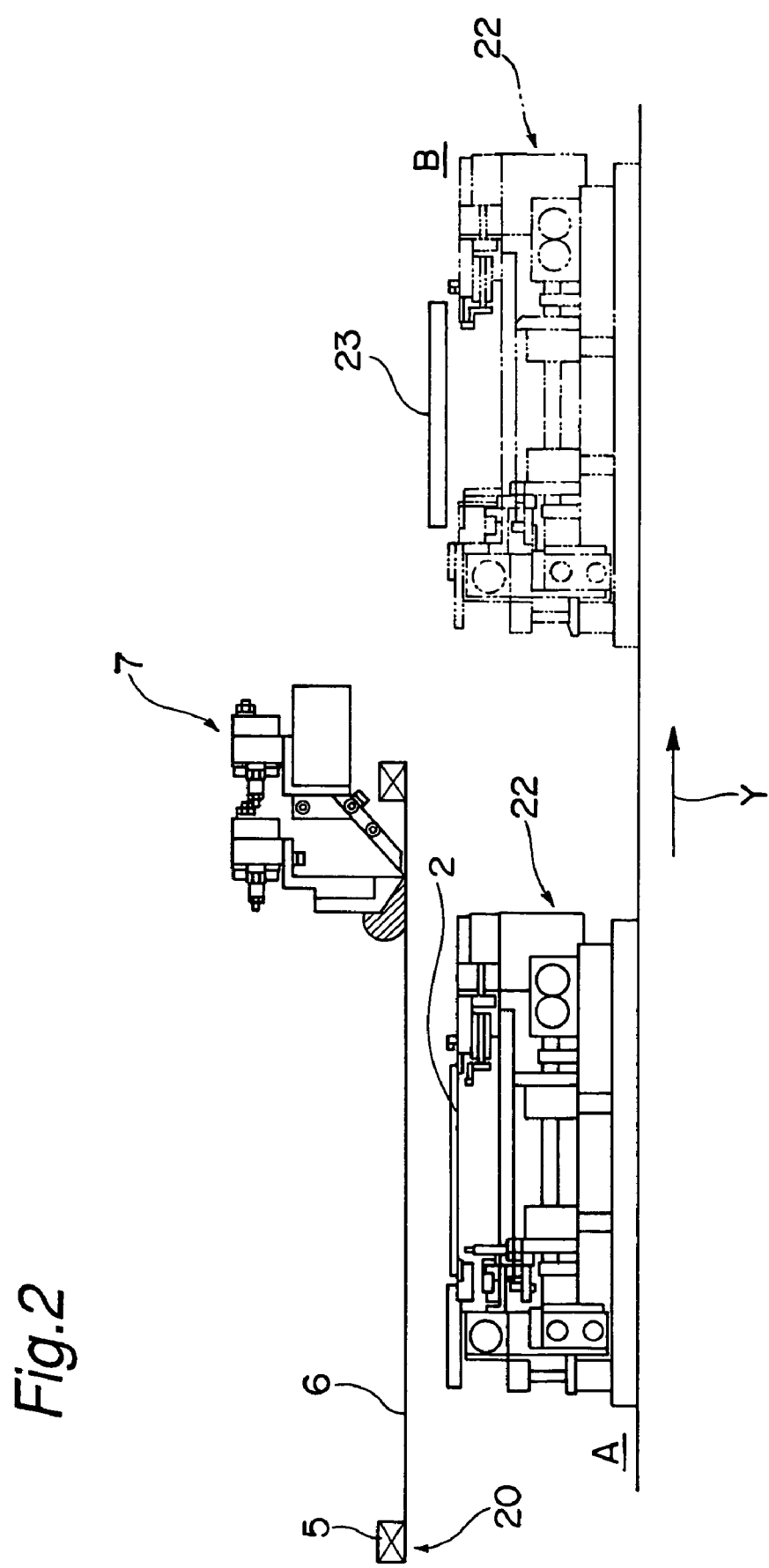
FIG. 2 is a side view showing the screen printing apparatus of FIG. 1.

The top view showing the configuration of a screen printing apparatus 20 exemplifying the printing apparatus for a bonding material in the first embodiment of the present invention is shown in FIG. 1, and its side view is shown in FIG. 2.

As shown in FIGS. 1 and 2, the screen printing apparatus 20 has a structure (an example of the board retaining device) to retain a printed circuit board 2 (hereinafter referred to as a board 2) by supporting the board 2 from a component mounting-side surface (lower surface) having a plurality of components or electronic components mounted thereon, and a structure (an example of the bonding material printing unit) to feed a solder paste (solder material) exemplifying the bonding material to a working-side surface (surface on the opposite side of the component mounting-side surface, i.e., the upper surface) of the retained board 2 through screen printing.

Figure 15:
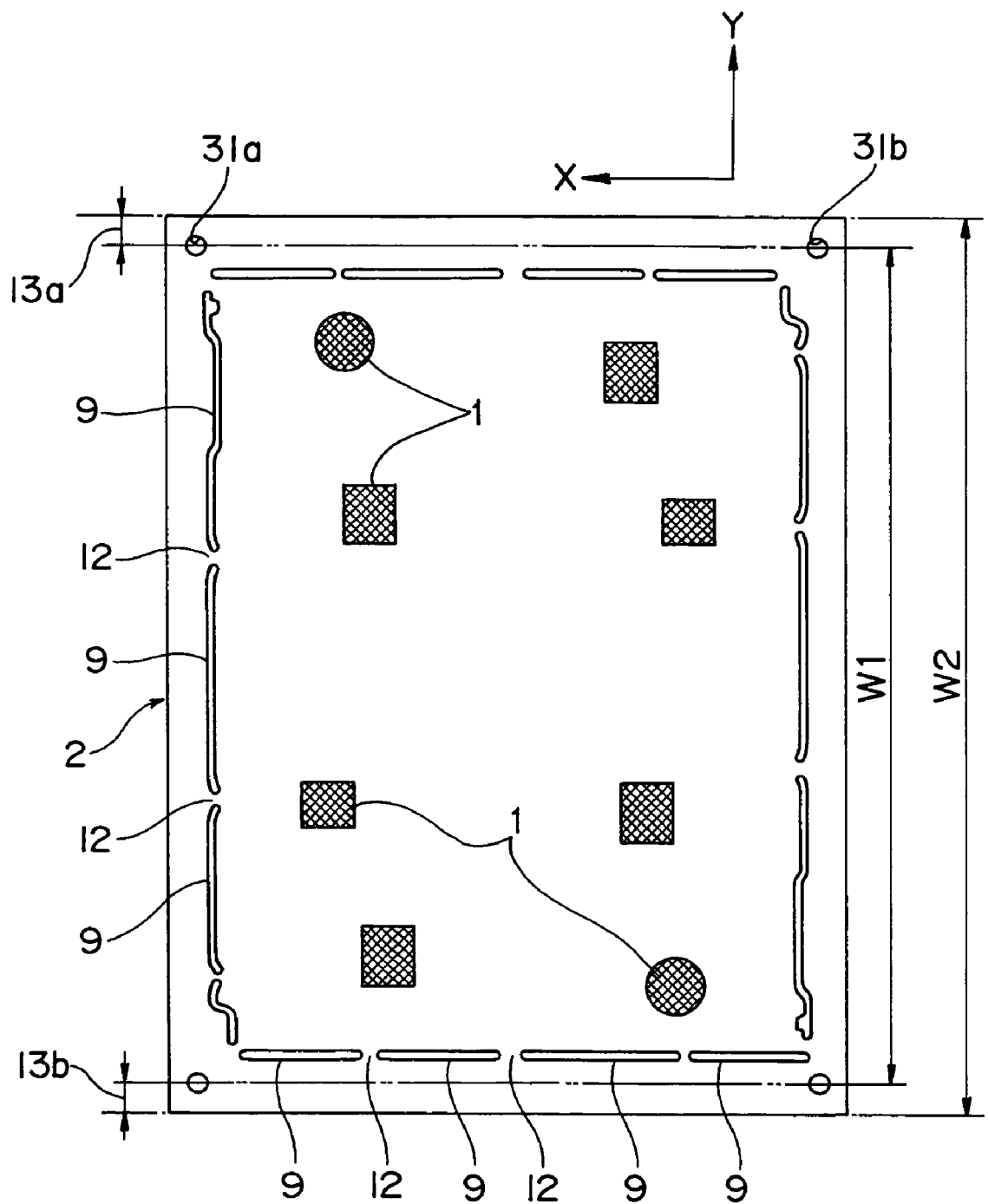
FIG. 15 is a plane view showing a component mounting-side surface of the board handled in the screen printing apparatus in the first embodiment.

First of all, the plane view of the component mounting-side surface of the board 2 handled in such a screen printing apparatus 20 is shown in FIG. 15. Herein, the board 2 is a board to form an electronic circuit with a plurality of electronic components mounted on both surfaces, i.e., a board for so-called double-sided mounting. In the board 2 shown in FIG. 15, one surface of both the surfaces in such a board for double-sided mounting is regarded as a component mounting-side surface S, and a plurality of electronic components 1 are mounted on the component mounting-side surface S while the electronic components 1 are not yet mounted on the other surface. Also, FIG. 15 is a schematic plane view showing the component mounting-side surface S having the respective electronic components 1 mounted thereon as a top face. It is to be noted that although not shown in FIG. 15, the surface on the side opposed to the component mounting-side surface S in the board 2 (i.e., the back surface of the component mounting-side surface S) ends up to have the respective electronic components 1 mounted thereon, and for this mounting, the surface is deemed as a working-side surface to which a solder paste is fed by the screen printing apparatus 20.

As shown in FIG. 15, the board 2 is in an almost square shape, and has a plurality of slit-like-hole portions 9 formed along its outer peripheral outline and through the board 2. These slit-like-hole portions 9 are provided so that after mounting of the respective electronic components 1 is completed and an electronic circuit is formed in the board 2, an inside region surrounded with the respective slit-like-hole portions 9, which is deemed as a product portion, is cut off and separated from the outer peripheral outline portion. On the component mounting-side surface S, the inside region surrounded with the respective slit-like-hole portions 9 constitutes the component mounting region, whereas a region outside the respective slit-like-hole portions 9 constitutes an outer periphery region (or edge portion region). Further, in order to facilitate the cutting-off operation, a plurality of slim connecting portions 12 for connecting a portion of the board 2 corresponding to the component mounting region and a portion corresponding to the outer periphery region are placed between the respective slit-like-hole portions 9. Therefore, by cutting off these link portions 12, the product portion can be separated.

Further, as shown in FIG. 15, end portion regions 13a, 13b in the outer periphery region of the board 2 each in the vertical direction in the drawing are the regions supported by a later-described belt conveyer for transportation of the board 2. At four corner portions of the board 2, positioning holes 31a, 31b are formed for positioning. It is to be noted that a description has been given of the case where the outer periphery region in the board 2 does not end up to be a product portion and is cut off from the component mounting region. However, the present embodiment is not limited to this, and there may be a case where, for example, the outer periphery region is not cut off but is used as a portion for fixing the product portion or for another usage. Therefore, it can be said that the outer periphery region in the board 2 is a region which is free from mounting of the components and which is substantially out of the constitution of the electronic circuit.

A specific description is given of the configuration of the screen printing apparatus 20 with reference to the drawings.

First, as shown in FIGS. 1 and 2, in the screen printing apparatus 20 located at a printing position A, a plate (plate surface portion) is formed in the center of a screen 6 whose periphery is supported by a screen frame 5 in conformity with a target printing pattern. When the board 2 which is a work is loaded therein, a Z table 22 is on standby below the screen printing apparatus 20.

When a loading and unloading direction of the board 2 is an X-axis direction, the Z table 22 is structured so as to be able to move reciprocally between the printing position A below the screen printing apparatus 20 and a posture control position B in a Y-axis direction orthogonal to the X-axis direction. At the posture control position B, a warpage straightening plate 23 is placed for straightening warpage of the board 2. It is to be noted that in the first embodiment, the region including the printing position A and the posture control position B constitutes a printing operation region to which operations necessary for screen printing of the board 2 are applied, and the board 2 loaded into the printing operation region is subjected to printing operation of a bonding material by the screen printing apparatus 20.

Figure 3:
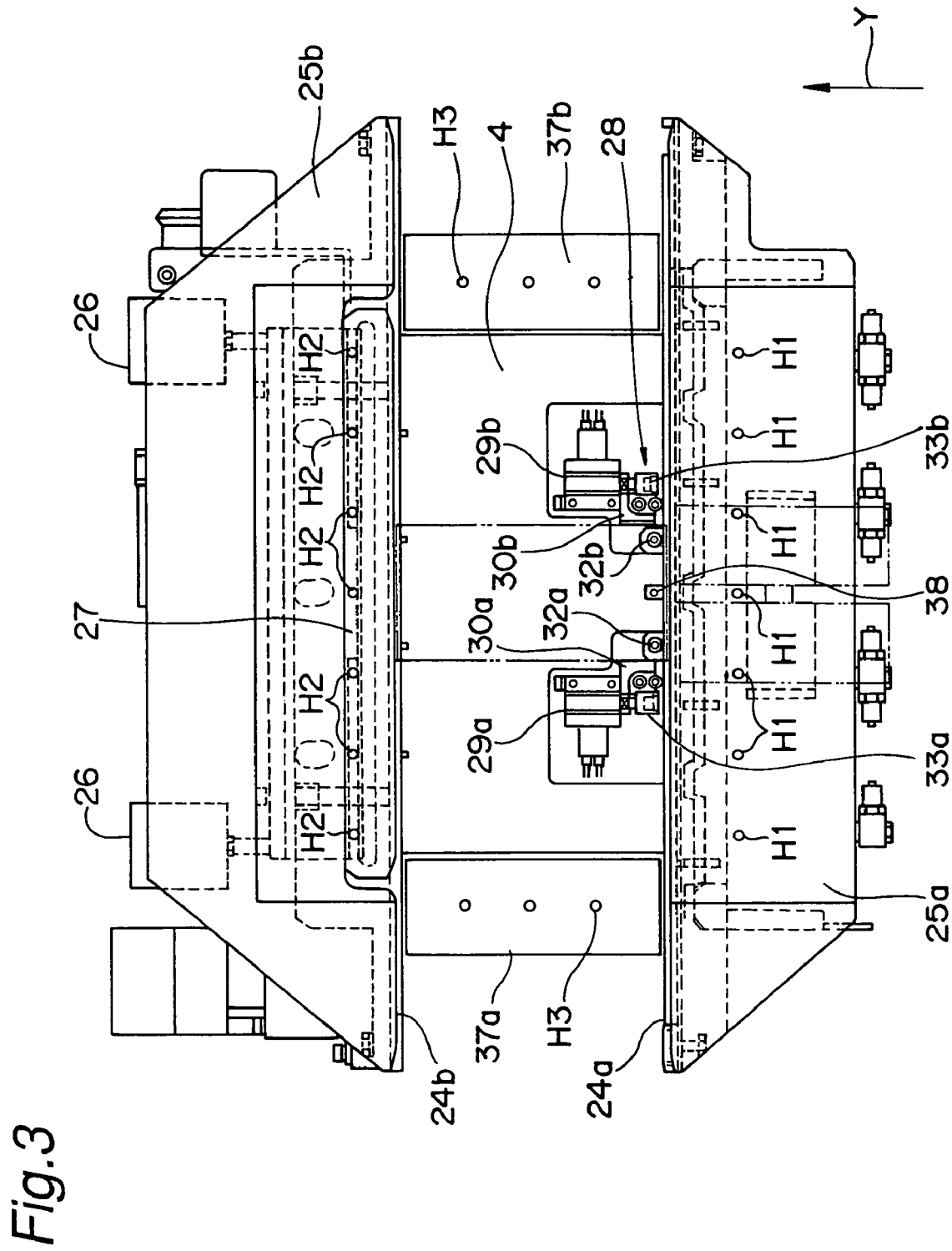
FIG. 3 is an enlarged plane view showing the screen printing apparatus in the first embodiment.

The Z table 22 is structured such that an X-axis table movable in the X-axis direction, a Y-axis table movable in the Y-axis direction and a θ-axis table movable in a rotational direction on the same plane (θ direction) are overlapped and secured in sequence on an Z-axis table movable in a vertical direction (Z-axis direction), where the uppermost row has a pair of belt conveyers 24a, 24b (an example of the transportation support member) as shown in FIG. 3.

The belt conveyers 24a, 24b have functions of transporting the loaded board 2 to the printing position A within the printing operation region, unloading the printed board 2 from the printing operation region, and transporting a next board 2 to the printing position A within the printing operation region. It is to be noted that in the first embodiment, the Z table 22 has a function as a board transporting unit for transporting the board 2 to the printing operation region and a function as a board retaining device for retaining the board 2.

Figure 4:
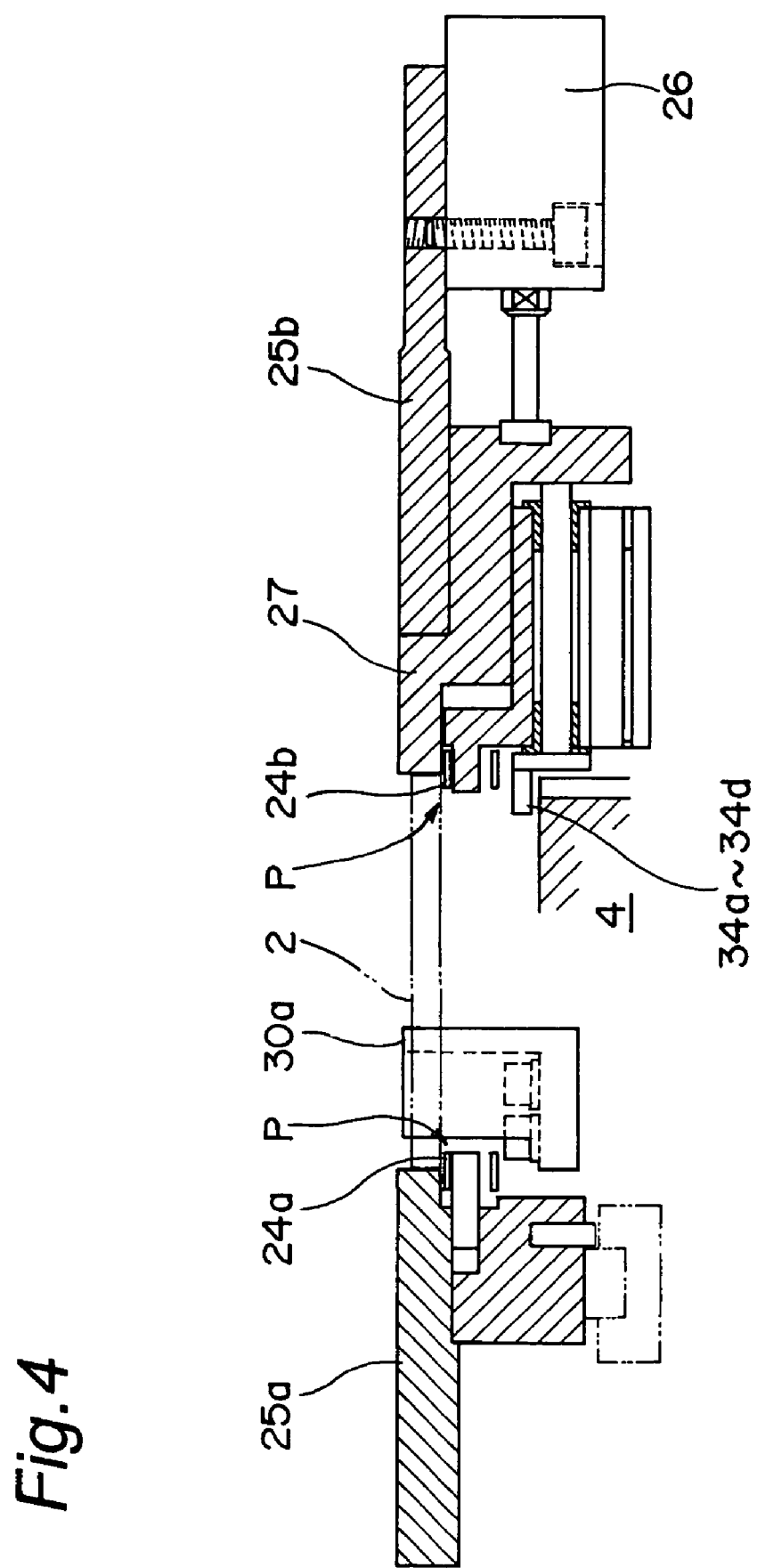
FIG. 4 is an enlarged schematic side view showing first and second support tables and their periphery included in the screen printing apparatus in the first embodiment.

The belt conveyer 24a is built in a first support table 25a fixed on the Z table 22 in a manner movable to a protruding position P (support position) shown in FIG. 4 and a retreat position Q (support release position), and is constantly biased to, for example, the protruding position P shown in FIG. 4.

The belt conveyer 24b is built in a second support table 25b which can be driven by a pulse motor (unshown) with respect to the Z table 22 in the Y-direction so that the disposition of an interval between the first support table 25a and the second support table 25b can be changed according to a width of the board 2 to be handled. Further, a regulation rail 27 capable of moving forward and backward in the direction of the first support table 25a by virtue of a cylinder unit 26 is incorporated in the second support table 25b.

The first and second support tables 25a, 25b include a transportation unit retreat unit 28 (see FIG. 3) for lifting the board 2, which reached the printing position A by the belt conveyers 24a, 24b, from the transportation surface and moving the belt conveyer 24a against a biasing force from the protruding position P to the retreat position Q. It is to be noted that the board 2 can be supported in the state that the belt conveyers 24a, 24b are positioned at the protruding position P (support position) and the support of the board 2 can be cancelled when the belt conveyers 24a, 24b are positioned at the retreat position Q (support release position). Further, in the first embodiment, the transportation unit retreat unit 28 exemplifies the support member moving unit.

The transportation unit retreat unit 28 provided on the first support table 25a is composed of a first positioning unit 29a positioned downstream the board 2 which reached the printing position A and a second positioning unit 29b positioned upstream, the first positioning unit 29a incorporating a stopper 30a protruding upward from the transportation surface of the belt conveyer 24a, a reference pin 32a movable in a vertical direction in the state that its head is inserted into a positioning hole 31a provided on the board 2, and a cylinder 33a for moving the belt conveyer 24a against the biasing force from the protruding position P to the retreat position Q. The second positioning unit 29b incorporates a stopper 30b protruding upward from the transportation surface of the belt conveyers 24a, 24b, a reference pin 32b movable in a vertical direction in the state that its head is inserted into a positioning hole 31b provided on the board 2, and a cylinder 33b for moving the belt conveyer 24a against the biasing force from the protruding position P to the retreat position Q.

Figure 5:
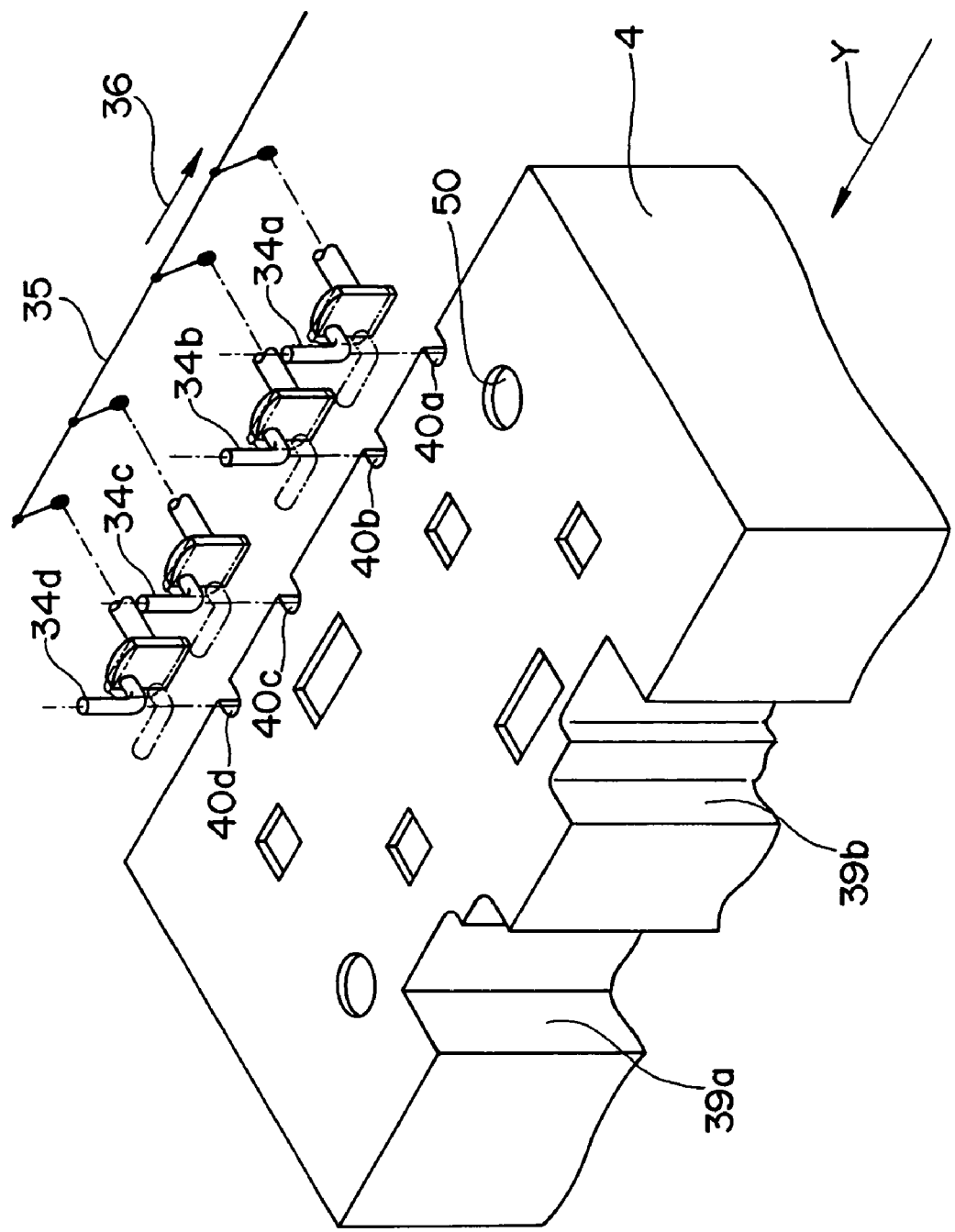
FIG. 5 is an enlarged schematic perspective view showing a suction block and its periphery included in the screen printing apparatus in the first embodiment.
Figure 6:
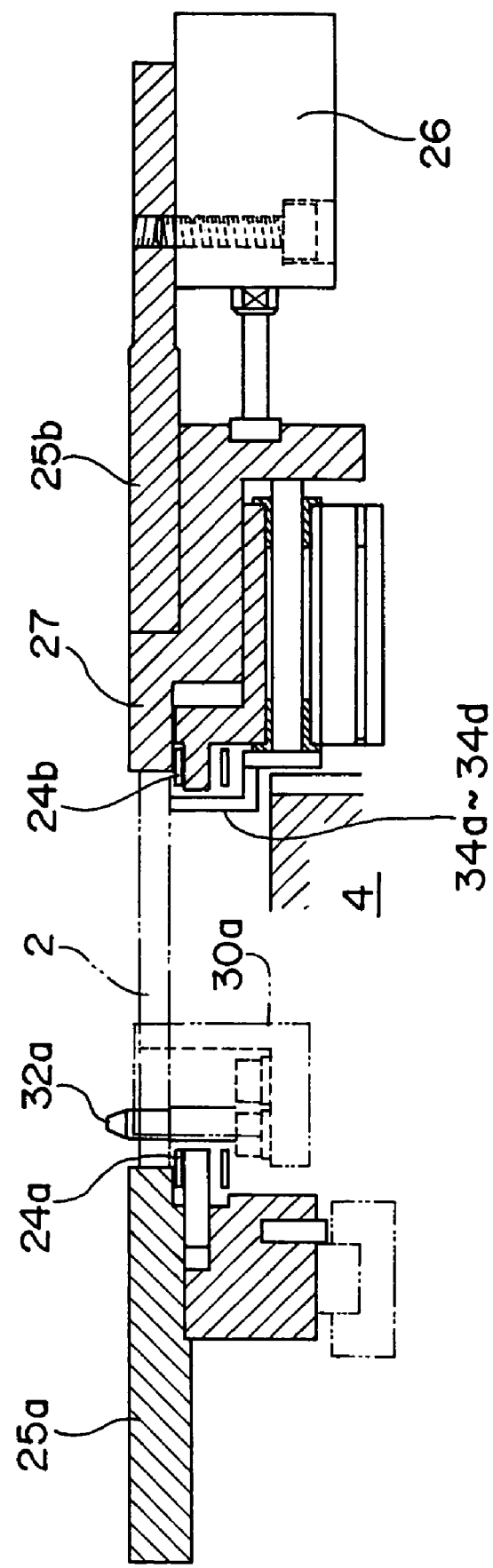
FIG. 6 is a process view showing the printing procedures in the screen printing apparatus of the first embodiment in the state of positioning a loaded board.

The transportation unit retreat unit 28 provided on the second support table 25b is, as shown in FIGS. 4, 5 and 6, composed of a plurality of levers 34a, 34b, 34c, 34d and the like placed at predetermined intervals in the transportation direction (X-axis direction). A plurality of the levers 34a to 34d are supported in a manner rotatable to a horizontal posture shown in FIG. 4 and to a standing posture in which their heads are positioned above the transportation surface, and respective rotation axes are linked to each other through a link mechanism 35 as shown in FIG. 5 so that moving the link mechanism 35 in the direction of an arrow 36 rotates a plurality of the levers 34a to 34b to a standing state. It is to be noted that rotation of the respective levers 34a, 34b, 34c and 34d by the link mechanism 35 are driven in synchronization with vertical movement of the reference pins 32a, 32b. Moreover, in the state of being positioned to have the standing posture, the respective levers 34a to 34d can support the lower surface of the board 2 with their heads, and this supporting operation is performed when the support of the board 2 by the belt conveyers 24a, 24b is cancelled.

Further, the Z table 22 has a suction block 4 exemplifying the board retaining block, which is located in a manner movable in a vertical direction between the first and second support tables 25a and 25b for sucking and holding the board 2 upon coming into contact with the component mounting-side surface that is the lower surface of the board 2. A width W2 (length size in the Y-axis direction) of the suction block 4 is set to be larger than a width W1 of the conventional support block 504.

Figure 7:
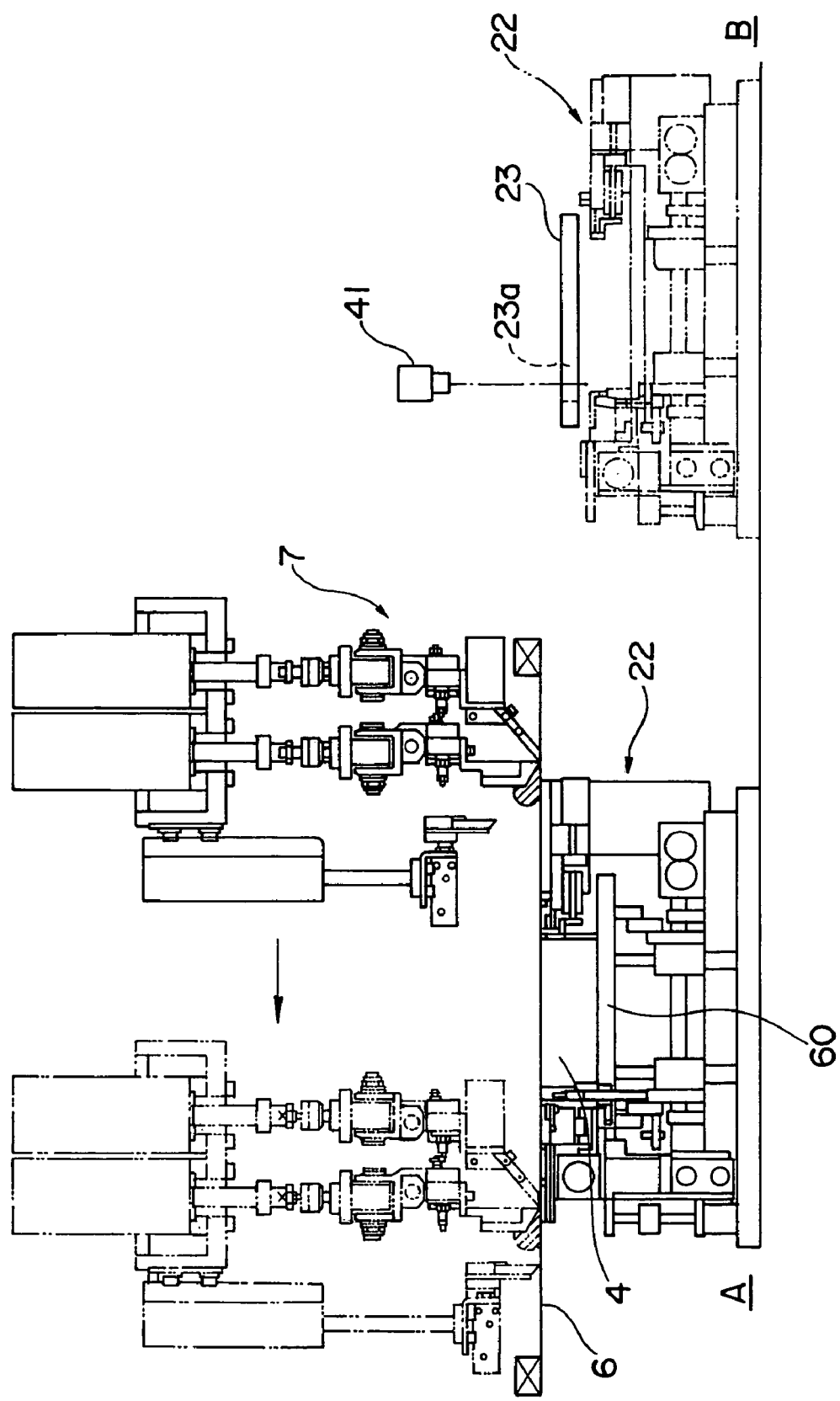
FIG. 7 is a process view showing the printing procedures in the state of screen printing.
Figure 8:
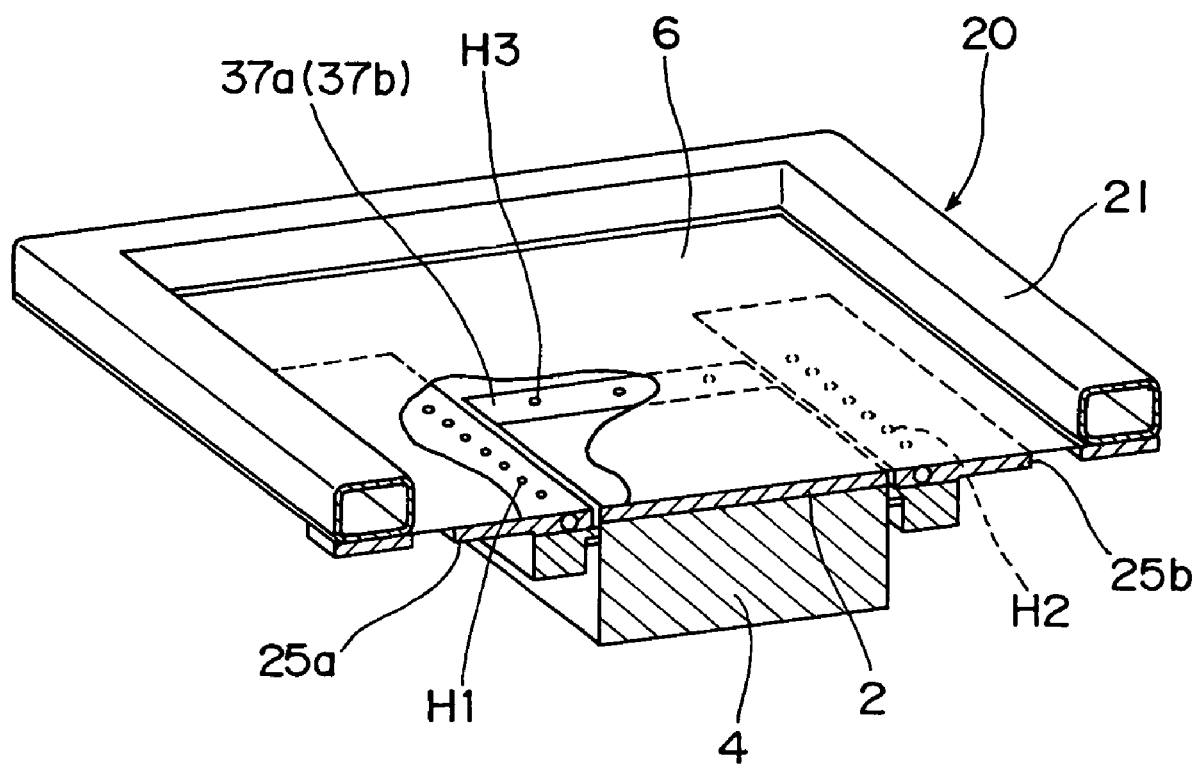
FIG. 8 is a schematic perspective view showing the configuration of a screen and its retaining unit included in the screen printing apparatus in the first embodiment.

As shown in FIG. 3 and FIG. 8, on the front and back side of the transportation direction of the suction block 4, suction units 37a, 37b are provided for sucking and holding the screen 6 at the same height as the first and second support tables 25a, 25b. Further, as shown in FIG. 7, the Z table 22 has an elevating unit 60 for integrally lifting and lowering the suction block 4 together with the respective suction units 37a, 37b, the lifting and lowering movement being independent of an ascending and descending movement of the Z table 22.

Operations of thus-structured respective portions can be subject to centralized control by a control unit (unshown) mainly made up of a micro computer while the operations are associated to each other. A detailed description will be hereinbelow given of the printing operation performed on the board 2 by such a screen printing apparatus 20. It is to be noted that respective operations by the screen printing apparatus 20 described below are subject to centralized control by the control unit.

As shown in FIG. 1 and FIG. 2, upon detection of arrival of the board 2 by an arrival sensor 38, the Z table 22 of the screen printing apparatus 20 which is waiting at a lower position of the screen printing apparatus 20 for the board 2 to be loaded sets the stopper 30a of the first positioning unit 29a to protrude upward from the transportation surface as shown in FIG. 4. The board 2 which reached the printing position A in the state of being placed on the belt conveyers 24a, 24b comes into contact with the stopper 30a of the first positioning unit 29a and stops, and upon detection of this, the control unit protrudes the stopper 30b of the second positioning unit 29b upward from the transportation surface and stops the board 2 at the printing position A.

Figure 9:
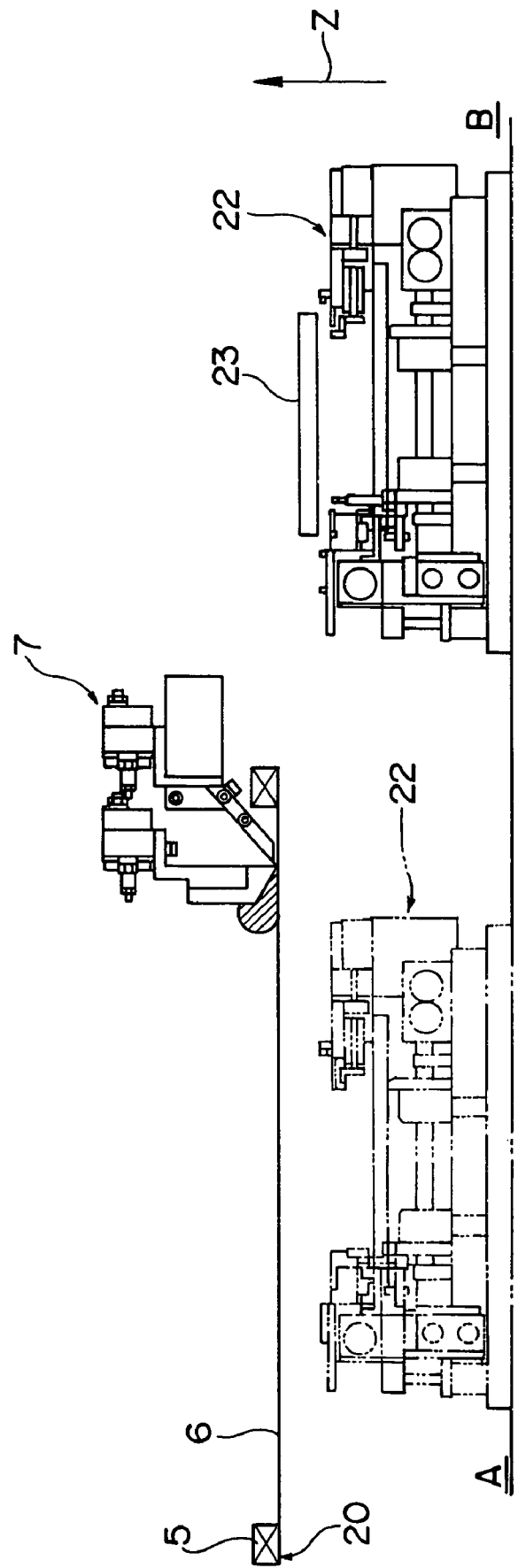
FIG. 9 is a process view showing the printing procedures in the state that a Z table is moved to a posture control position.

Next, the control unit moves the Z table 22 to the posture control position B as shown in FIG. 9. Herein, first, positioning pins 32a, 32b of the first and second positioning units 29a, 29b are elevated as shown in FIG. 6 and their ends are inserted into the positioning holes 31a, 31b (see FIG. 15). At the same time, the link mechanism 35 is driven so that a plurality of the levers 34a to 34d on the side of the belt conveyer 24b are rotated to the standup position, so that the board 2 is lifted from the transportation surface of the belt conveyers 24a, 24b by the elevated positioning pins 32a, 32b and the levers 34b, 34c in the standup position as shown in FIG. 6.

In the suction block 4, there are formed, as shown in FIG. 5, recess portions 39a, 39b for avoiding interference with the first and second positioning units 29a, 29b as well as recess portions 40a to 40d corresponding to a plurality of the levers 34a to 34d for avoiding interference with a plurality of the levers 34a to 34d in the standup state.

Figure 10:
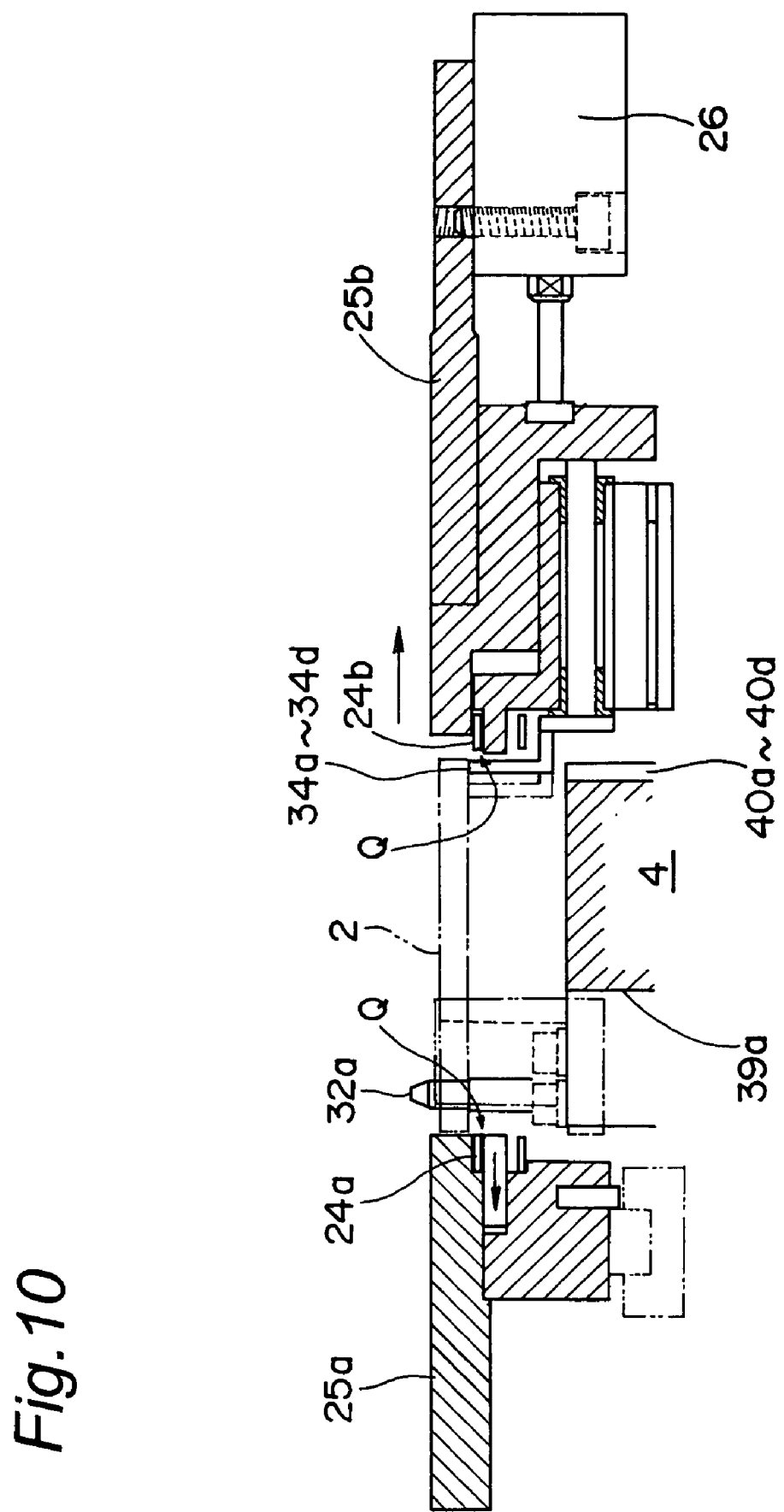
FIG. 10 is a process view showing the printing procedures in the state that the support of the board by a belt conveyer is cancelled.

Next, the control unit drives the cylinders 33a, 33b incorporated in the first and second positioning units 29a, 29b to bias the belt conveyer 24a to the retreat position Q as shown in FIG. 10, while moving the entire second support table 25b with respect to the Z table 22 in the Y-axis direction so that the positions of the recess portions 40a to 40d of the suction block 4 are aligned with the levers 34a to 34d. In this state, the board 2 is shifted from the state of being supported by the belt conveyers 24a, 24b to the state of being supported by the respective levers 34a to 34d, indicating that support cancel and transfer of the support were performed.

Figure 11:
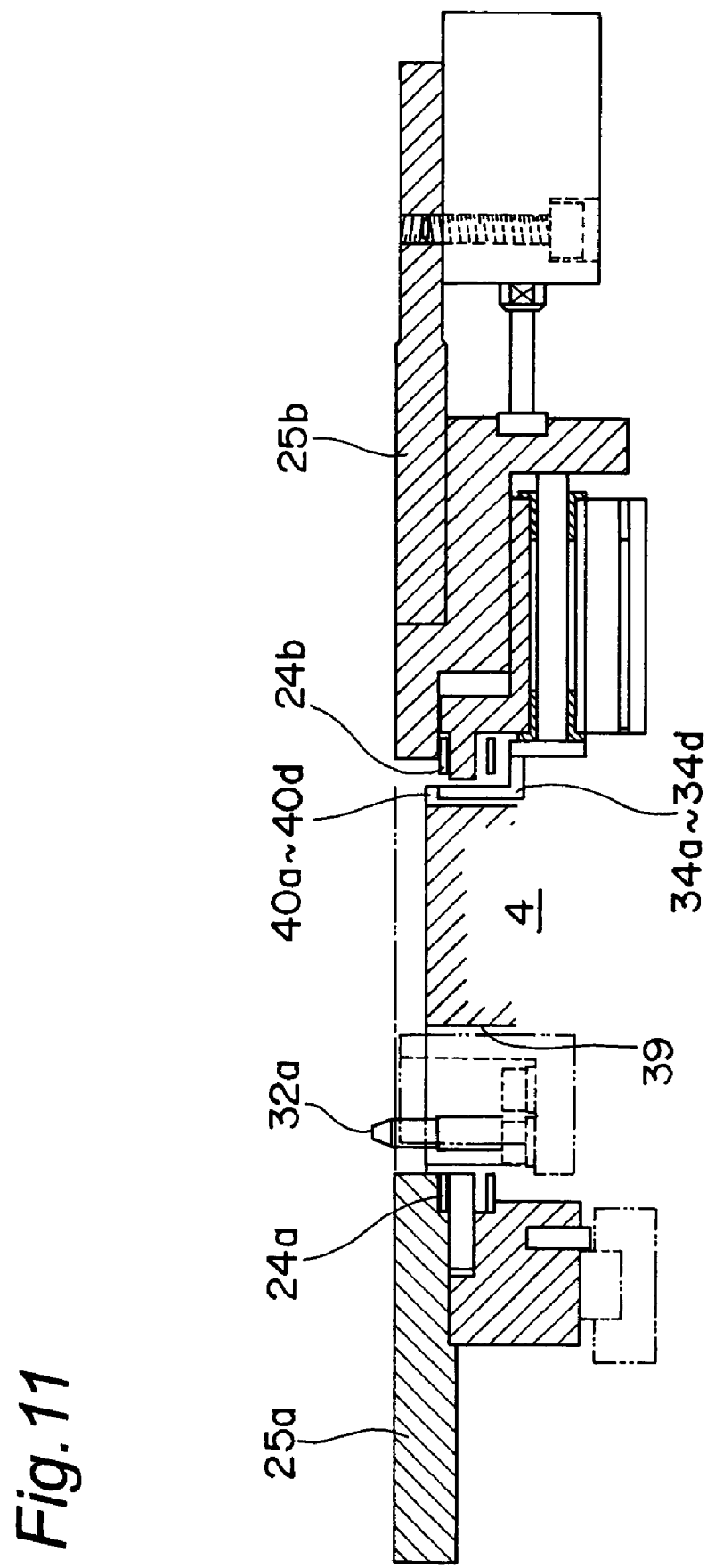
FIG. 11 is a process view showing the printing procedures in the state that following the state of FIG. 10, the board is supported by a suction block.

Further, the control unit elevates the suction block 4 by the elevating unit 60 as shown in FIG. 11 to bring the suction face of the suction block 4 into contact with the component mounting-side surface S of the board 2, and the suction block 4 is further elevated in this contact state so as to lift the board 2 from the reference pins 32a, 32b and the levers 34c, 34d. Eventually, by transfer of support, the board 2 in the state of being supported by the respective levers 34a to 34d is shifted to the state of being supported by the suction block 4. Therefore, it can be said that the respective levers 34a to 34d c have a function as a support transfer member.

Figure 12:
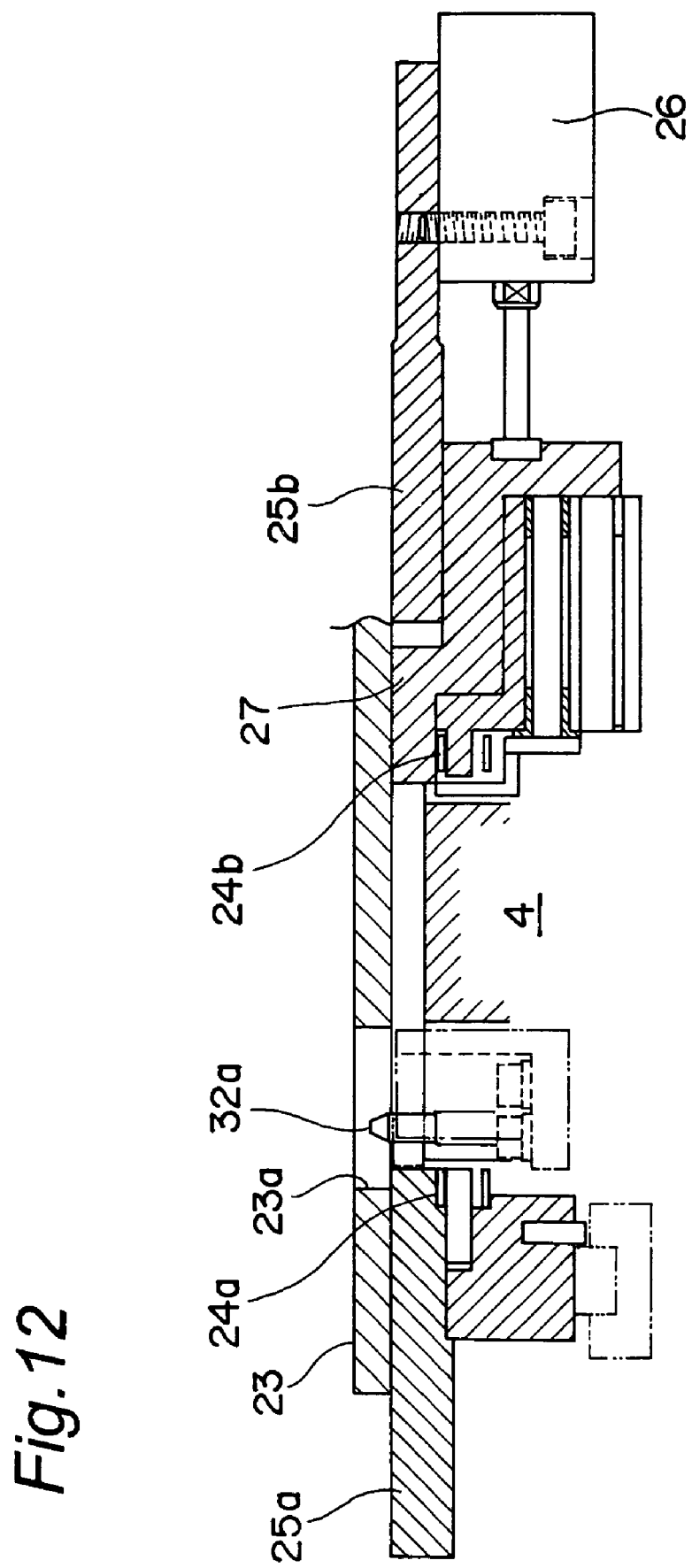
FIG. 12 is a process view showing the printing procedures in the state that following the state of FIG. 11, the supported posture of the board is straightened and retained.

Next, the control unit lifts the Z table 22 as shown in FIG. 9 and FIG. 12, and the board 2 is interposed in between the warpage straightening plate 23 and the suction block 4 for straightening the board 2 so as to eliminate warpage. After lowering the reference pins 32a, 32b, the control unit drives the cylinder unit 26 attached to the second support table 25b to move the regulation rail 27 for a specified quantity in a direction toward the first support table 25a so as to regulate displacement of the board 2 in the Y-axis direction by the first support table 25a and the regulation rail 27.

Thus, in the state that the board 2 is interposed in between the warpage straightening plate 23 and the suction block 4 to straighten the warpage, the suction block 4 is also in contact with the end portion regions 13a, 13b (see FIG. 15), which are portions in contact with the transportation surface of the belt conveyers 24a, 24b during transportation of the printed circuit board 2.

The control unit opens a connection valve between the suction block 4 and a vacuum source for the suction block 4 to suck the board 2. In this state, the suction block 4 is in contact with the board 2 with a width dimension W2 which is larger than the conventional width dimension W1, so that the suction block 4 sucks the board 2 including the respective end portion regions 13a, 13b on the component mounting-side surface S, the regions which have conventionally not been sucked and held.

Thus, upon completion of suction and retention by the suction block 4, the control unit lowers the Z table 22 and separates the board 2 from the warpage straightening plate 23.

In the control unit, a positional relationship between the posture control position B and a formation position of a plate of the screen 6 included in the screen printing apparatus 20 is registered in advance. Next, the control unit moves the board 2 retained by the Z table 22 back and forth and around at the position below the warpage straightening plate 23, and an image of a positioning mark (unshown) formed on the board 2 is taken by a singularity of or a plurality of TV cameras 41 through a window 23a (see FIG. 1) formed on the warpage straightening plate 23, and further, the X table, the Y table and e table are operated where necessary so that the positioning mark is aligned with a position of the plate surface portion of the screen printing apparatus 20 in the later step.

Thus, the Z table 22 carrying the board 2 with a corrected retention posture returns from the posture control position B to the printing position A that is the position shown by a solid line position in FIG. 2, and then is elevated in the Z direction as shown in FIG. 7 so as to bring the first and second support tables 25a, 25b and the suction units 37a, 37b closer to the screen 6.

Next, the control unit opens a connection valve between the first and second support tables 25a, 25b and the vacuum source, and a connection valve between the suction units 37a, 37b and the vacuum source, and as shown in FIG. 8, the lower surface region of the screen 6 at four corners of the plate (i.e., peripheral vicinity region of the plate) are sucked by the first and second support tables 25a, 25b and the suction units 37a, 37b so that the plate face portion is brought into close contact with the printed circuit board 2. It is to be noted that as shown in FIG. 3, portions on the upper surface of the first and second support tables 25a, 25b which are in contact with the lower surface region of the screen 6 have a plurality of suction holes H1, H2, and the lower region of the screen 6 in the contact state is sucked by the respective suction holes H1, H2 so as to be able to retain the contact state. In the first embodiment, these suction holes H1, H2 and a mechanism for inducing the suction operation (unshown) constitute the screen retaining device for sucking and holding the screen 6. It is to be noted that in FIG. 3, reference numeral H3 denotes a suction hole formed on each of the suction units 37a, 37b.

It is to be noted that in the state that the screen is sucked, it is checked by a laser displacement gauge (unshown) whether or not the screen 6 develops elongation or slack, and if the screen 6 develops elongation or slack, then replacement of the screen 6 is notified. The step for checking elongation or slack of the screen 6 by the laser displacement gauge is programmed to be executed after every printing operation or after completion of a predetermined number of printing operations.

Next, the control unit operates a squeegee unit 7 so as to move from a position shown by a solid line to a position shown by a virtual line in FIG. 7 along the upper surface of the screen 6 as viewed in the drawing so as to fill solder paste 8 into the plate of the screen 6. It is to be noted that in the first embodiment, the squeegee unit 7 exemplifies the printing unit for printing and feeding a bonding material, and the screen 6 and the squeegee unit 7 constitute the bonding material printing unit.

Figure 13A:
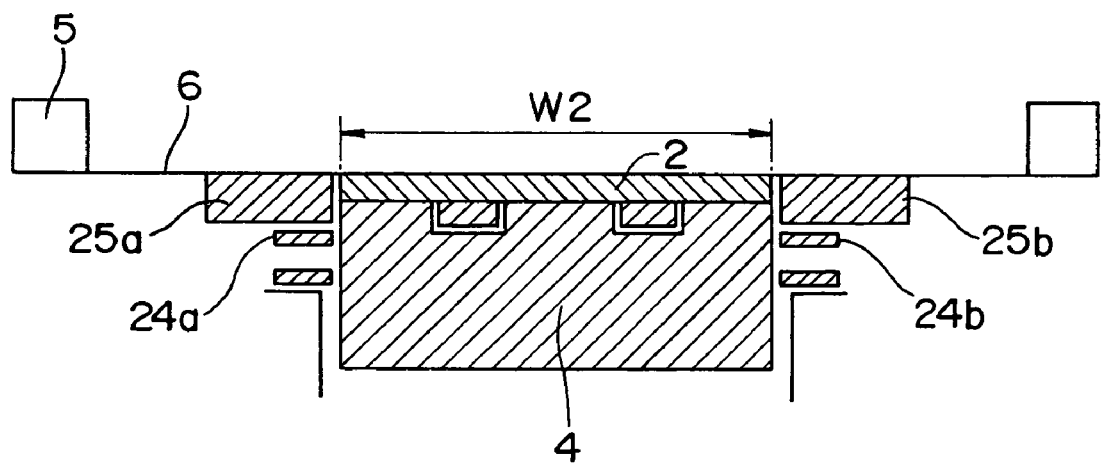
Figure 13B:
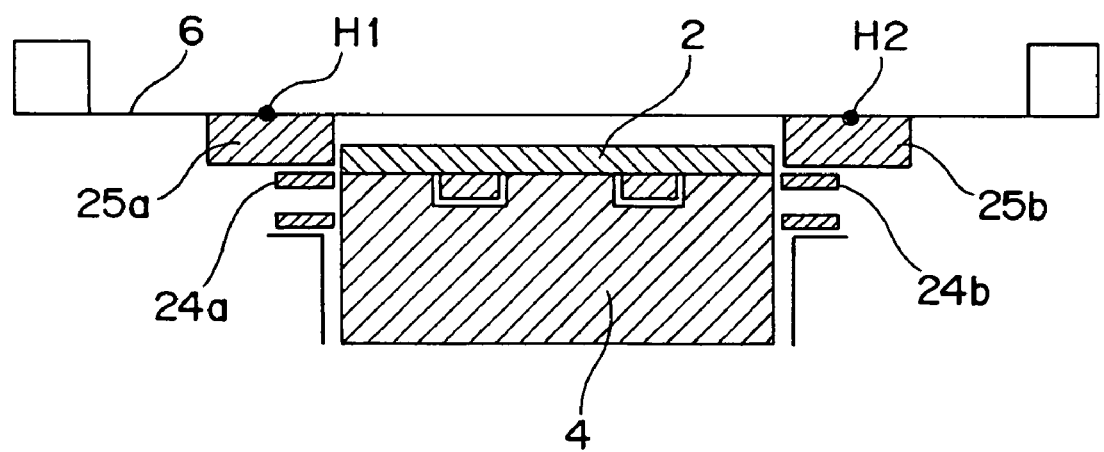

In the state that filling of the solder paste 8 is finished, while the state that the screen 6 is sucked and held by the first and second support tables 25a, 25b is maintained, the state that the screen 6 is sucked by the suction units 37a, 37b is cancelled. The control unit instructs the elevating unit 60 to descend in the state that the respective suction holes H1, H2 of the first and second support tables 25a, 25b keep on sucking the screen 6 as shown in FIG. 13A and FIG. 13B, by which the suction block 4 and the suction units 37a, 37b are lowered and the upper surface of the board 2 is separated from the lower surface of the screen 6.

Then, in the reverse procedure to those described with reference to FIGS. 12, 11, 10 and 6, the valves between the suction block 4, the first and second support tables 25a, 25b, the suction units 37a, 37b and the vacuum source are closed to stop vacuum suction, and after the suction block 4 is further lowered from the transportation surface of the belt conveyers 24a, 24b, the cylinders 33a, 33b of the first and second positioning units 29a, 29b are stopped driving, and the belt conveyer 24a is returned to an initial position while the second support table 25b is brought closer to the side of the first support table 25a so as to be returned to the initial position, the reference pins 32a, 32b as well as the levers 34a to 34d are returned to the initial position, and the board 2 on which the solder paste has been printed is placed again on the belt conveyers 24a, 24b.

In this state, the stoppers 30a, 30b incorporated in the first and second positioning units 29a, 29b are lowered below the transportation surface, and the belt conveyers 24a, 24b are operated so as to move the board 2 from the printing position A in the X direction as viewed in the drawing and to unload the board 2 from the printing operation region, i.e., the screen printing apparatus 20.

Thus, even in the board 2 with a fewer points available for suction and retention due to advanced high-density mounting, retreat of the belt conveyer 24a and separation of the second support table 25b from the first support table 25a as described with reference to FIG. 6 to FIG. 10 make it possible to enlarge the points available for suction by the suction block 4 including the end portion regions 13a, 13b of the board 2 placed on the transportation surface, and therefore even the board 2 with high-density mounting can obtain the suction and retention functions sufficient for straightening and retaining operations.

Further, when the screen 6 and the board 2 are separated, i.e., screen release is performed, in the state that the respective suction holes H1, H2 included in the first and second support tables 25a, 25b keep on sucking the region in the vicinity of the periphery of the plate face of the screen 6, the elevating unit 60 lowers the suction block in the state of sucking and holding the board 2. Accordingly, even if screen release is inefficient, vertical vibration of the screen 6 generated during the screen release is considerably reduced, and bleeding and dropout failures are less likely to occur in printing, thereby bringing about good printing results.

Figure 14A:
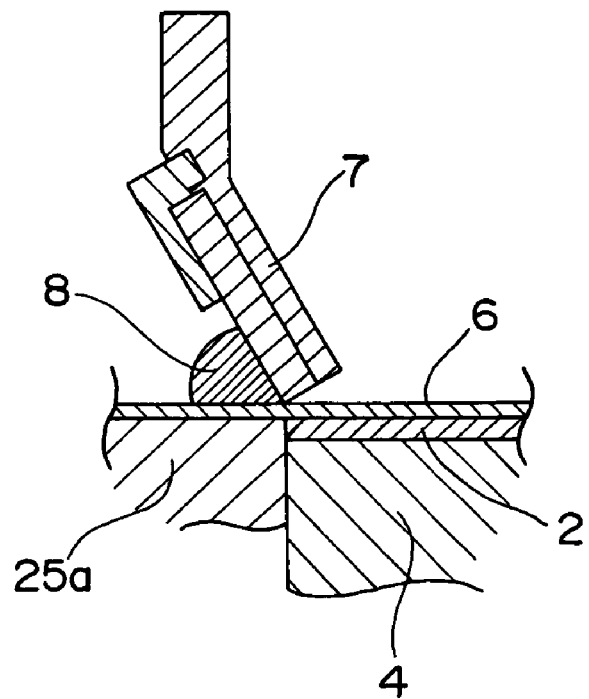
Figure 14B:
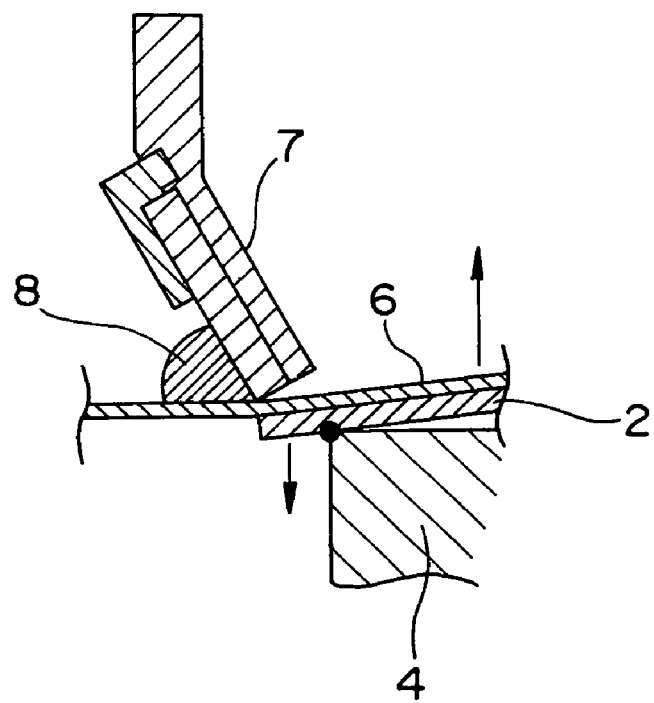
FIG. 14B is a schematic explanatory view showing a comparative example of FIG. 14A.

Further, immediately after the squeegee unit 7 which moved on the screen 6 passed a section on the upper surface of the board 2 as shown in FIG. 14A, the squeegee unit 7 is shifted to the first support table 25a, so that lifting of the plate will not occur. More specifically, in the case of the conventional printing apparatus having no first support table 25a provided adjacent to the section on the upper surface of the board 2 as shown in FIG. 14B, immediately after the squeegee unit 7 passed the section on the upper surface of the board 2, the squeegee unit 7 may push down the board 2 and cause lifting of the board 2, thereby causing the printing results to have bleeding. However, in the screen printing apparatus 20 in the first embodiment, providing the first support table 25a prevents the board 2 from lifting, and allows good printing results to be produced.

Although in the above, it has been described that the suction and retention region by the suction block 4 is enlarged so as to include all the respective end portion regions 13*a*, 13*b* on the component mounting-side surface S of the board 2, if the suction and retention region is enlarged so as to include a part of the respective end portion regions 13*a*, 13*b*, reliable suction and retention can still be achieved unlike in the case of the conventional suction and support method.

In the above description, the solder paste is filled in the state that the screen 6 is sucked by the first and second support tables 25*a*, 25*b* and the suction units 37*a*, 37*b*, and during screen release, the first and second support tables 25*a*, 25*b* are maintained in the state of sucking the screen 6. However, in the case where efficient screen release is available, it is possible to structure such that in the screen release stage, suction of the screen by the first and second support tables 25*a*, 25*b* and the suction units 37*a*, 37*b* is cancelled.

Further, in the case where warpage of the screen frame 5 or the like is not present and the screen 6 and the board 2 are in a good close contact state without application of screen suction, it is possible to structure such that only in the screen release stage, the screen 6 is sucked by the first and second support tables 25*a*, 25*b*.

It is to be noted that although during the screen release, the screen 6 is sucked in the state that its both sides are sucked by the first and second support tables 25*a*, 25*b*, good results can also be expected by the screen release while only one side is sucked. More specifically, in printing by the squeegee unit 7, a squeegee head reciprocally moves between the position shown by a solid line and the position shown by a virtual line in FIG. 7 to conduct printing operation, whereas if it is structured such that printing is conducted only during the approach route from the solid line position to the virtual line position shown in FIG. 7 and the screen 6 is set to be sucked by the first support table 25*a* positioned on the downstream side of the printing direction, good screen release can still be achieved.

Further, since the second support table 25*b* is structured to be driven in a direction close to or away from the first support table 25*a* according to the size of the board 2 to be handled, the board 2 that reached the printing position A can be lifted from the transportation surface and a pair of the belt conveyers can be moved to the outside of both the end portions in a direction orthogonal to the transportation direction of the board 2, and further the transportation unit retreat unit 28 can save a space in which the suction block 4 with a maximum width W2 can be lifted and lowered without interference with the belt conveyers by providing the cylinders 33*a*, 33*b* only on the side of the first support table 25*a* so as to move the belt conveyer 24*a* against the biasing force to the retreat position Q, and by moving the entire second support table 25*b* in a direction away from the first support table 25*a* with respect to the belt conveyer 24*b*, which makes it possible to simplify the constitution.

It is to be noted that on the upper surface of the suction block 4, recess portions 50 are formed in conformity with the disposition of a plurality of the electronic components 1 mounted on the component mounting-side surface S of one side of the board 2, so that when the board 2 is sucked and held, interference between the respective electronic components 1 and the suction block 4 can be avoided.

Further, in the case of model change of the board 2 to be handled, a replacement operation is performed to replace the suction block 4 to a new suction block 4 having the recess portions 50 corresponding to the disposition of electronic components on the newly-changed board 2. Accordingly, at any point of time during the step of sucking the board 2 by the suction block 4, flatness of the board 2 is checked by a laser displacement gauge immediately after the model change, by which replacement mistake of the suction block 4 can be detected. Cases of the replacement mistake include the following examples.

(1) Due to misalignment of the mounting positions of the electronic components 1 and the positions of the recess portions 50, the electronic components 1 mounted on the board 2 are shifted to the outside of the recess portions 50, resulting in the board 2 being sucked by the suction block 4 in the state of being distorted upward.

(2) Although the mounting positions of the electronic components 1 and the positions of the recess portions 50 are aligned, the depth of the recess portions 50 are smaller than the electronic components 1 so that the board 2 is sucked by the suction block 4 in the state of being distorted.

(3) Although the mounting positions of the electronic components 1, the positions of the recess portion 50, and the depth of the recess portions 50 are appropriate, the board thickness of the board 2 is inappropriate.

Further, in the step of detecting a replacement mistake of the suction block 4 by the laser displacement gauge, a laser displacement gauge is located beside the TV camera 41 and the replacement mistake is observed through a window 23*a* of the warpage straightening plate 23. As one example, this detection step may be executed before operating the X table Y table and e table so as to be aligned with the position of the plate face portion of the screen printing apparatus 20.

It is to be noted that although in the first embodiment, a description has been given of the case where the solder paste as a viscous article is printed on the board 2, the configuration and the printing method of the printing apparatus 20 are applicable to the case where instead of the solder paste, viscous articles such as conductive paste or adhesive are printed on the board 2.

Second Embodiment

Figure 18:
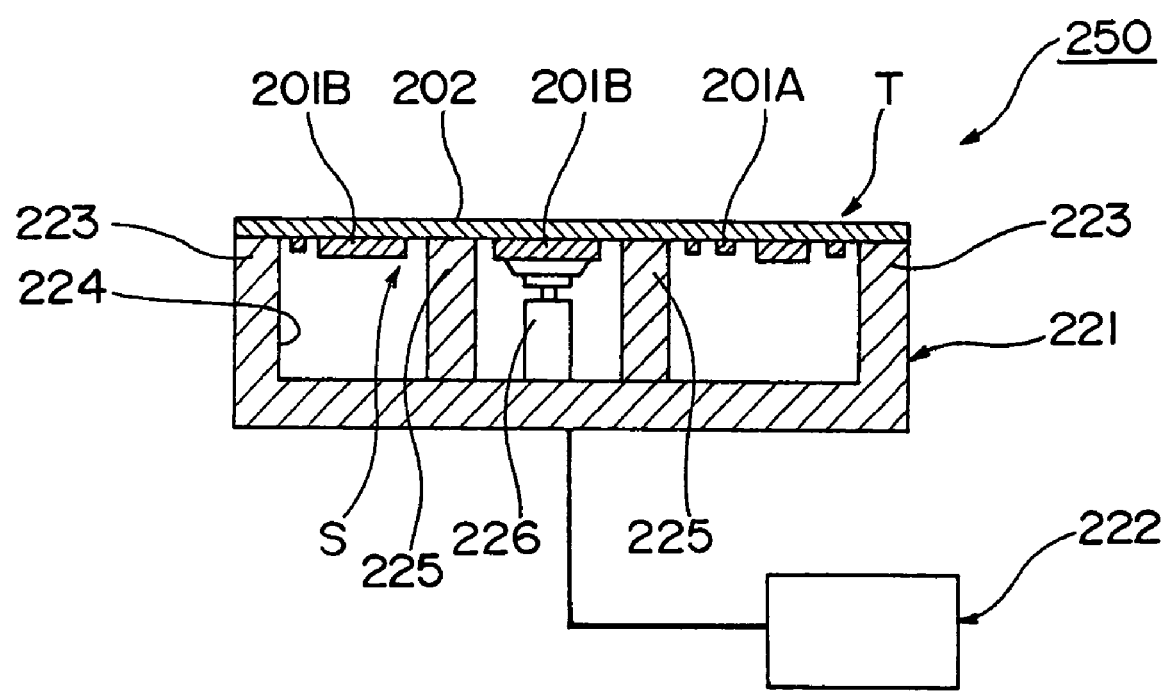
FIG. 18 is a schematic cross sectional view showing a board retaining device included in the screen printing apparatus of FIG. 16.

It is to be understood that the present invention is not limited to the embodiment disclosed and can be embodied in various forms. For example, FIG. 18 shows the schematic perspective view of the outline of a screen printing apparatus 101 exemplifying a printing apparatus for a bonding material in a second embodiment of the present invention.

Figure 16:
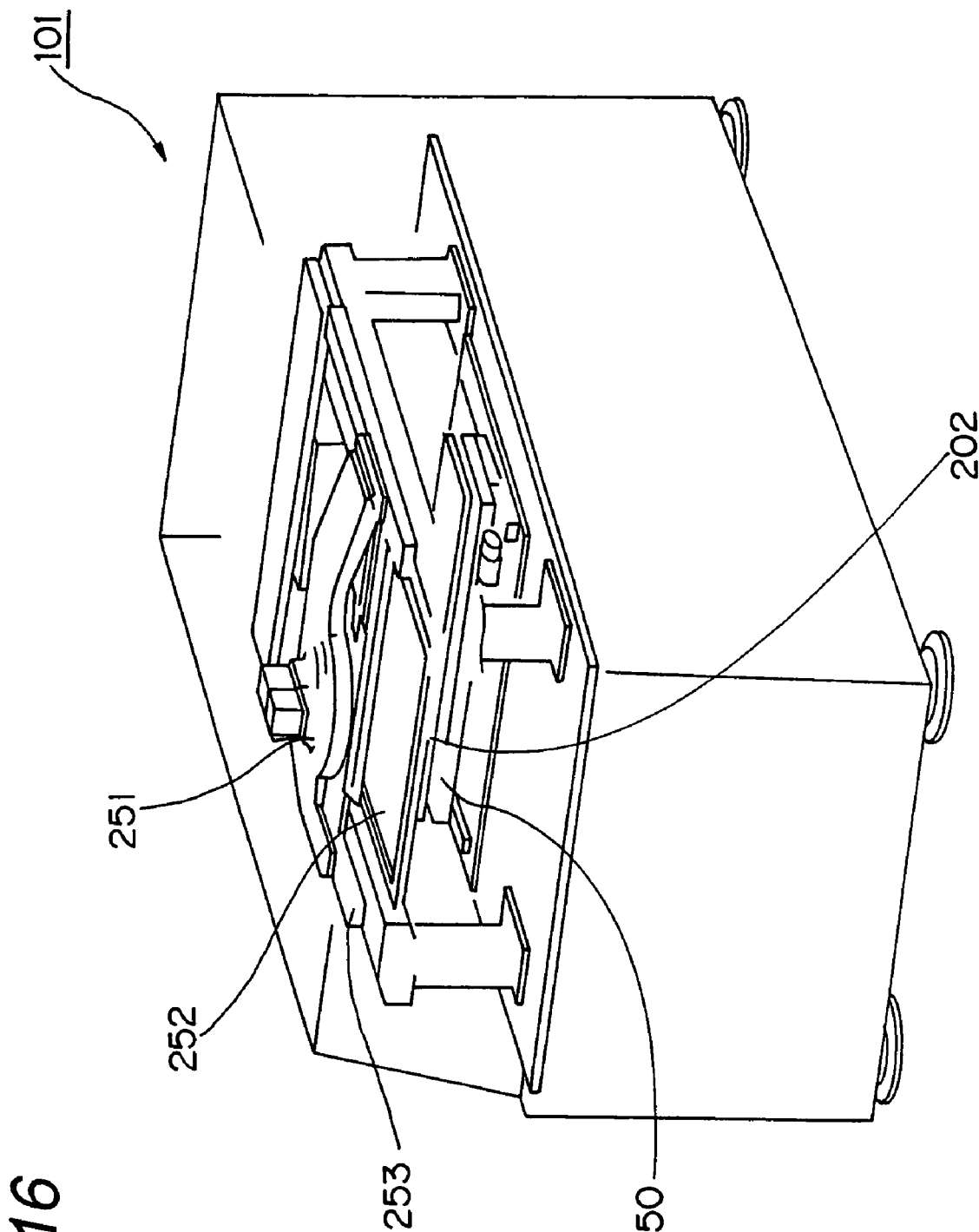
FIG. 16 is a schematic exterior perspective view showing a screen printing apparatus in a second embodiment of the present invention.

As shown in FIG. 16, the screen printing apparatus 101 has a board retaining device 250 to support a board 202 from a component mounting-side surface having a plurality of components or electronic components mounted thereon and to retain the support position of the board from a working-side surface that is the surface opposed to the component mounting-side surface of the board 202, and a structure (an example of the bonding material printing unit) to feed a solder paste to the working-side surface (i.e., the upper surface) of the board 202 retained by the board retaining device 250 through screen printing. The structure to perform the screen printing includes a screen 252 which has a plate surface for performing the screen printing and is placed on the working-side surface of the board 202, a printing head 251 having a squeeze (unshown) for feeding a solder paste through the screen 252 and an elevating unit for performing lifting and lowering operation of the squeeze, and a head moving unit 253 for moving the squeeze along the screen 252 by moving the printing head 251 in an almost horizontal direction.

By constituting the screen printing apparatus 101 as such, the solder paste can be fed by the printing head 251 or the like to the upper surface of the board 202 retained by the board retaining device 250 in the shape and disposition congruent with the plate surface of the screen 252.

It is to be noted that the screen printing apparatus 101 in the second embodiment is different from the screen printing apparatus 20 in the first embodiment in the structure of retaining the board 202, whereas the structure to perform screen printing is substantially the same in both the embodiments. A description is hereinbelow given mainly of the different structure.

Figure 17:
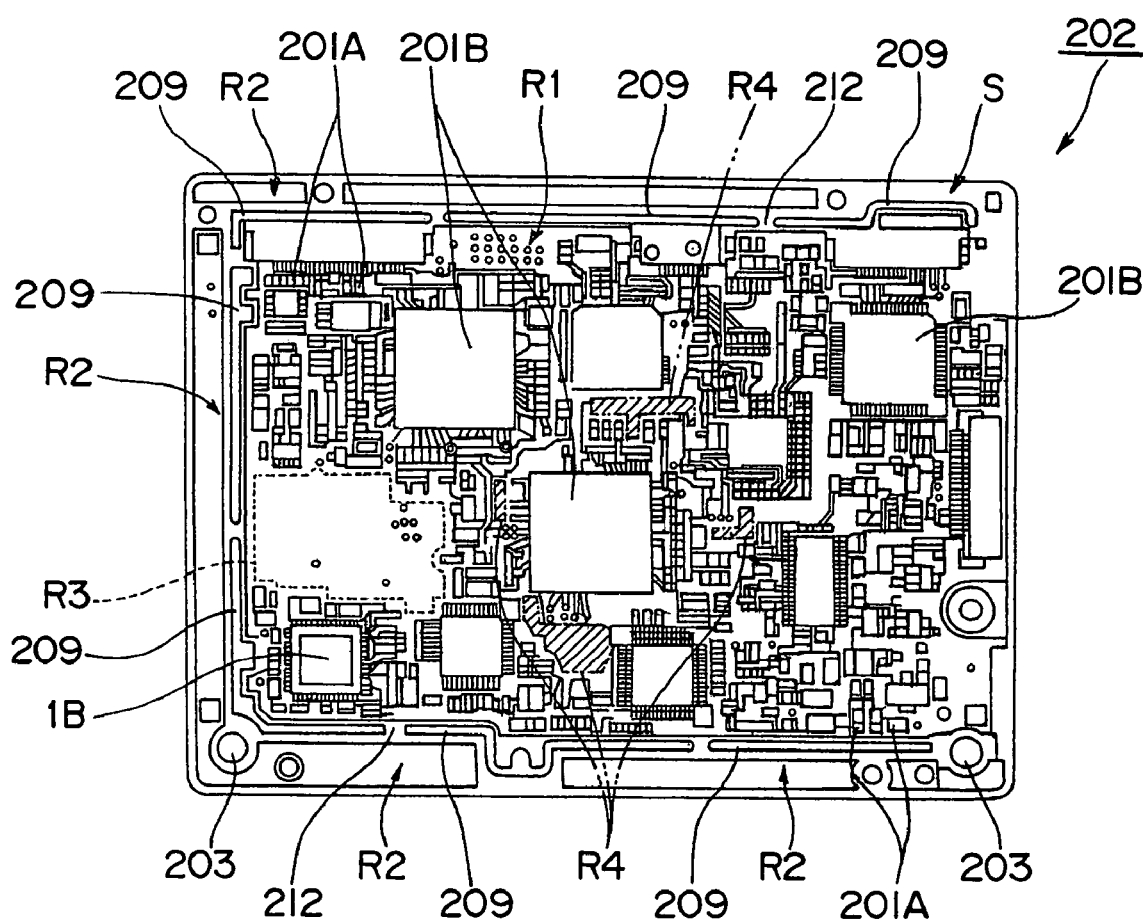
FIG. 17 is a plane view showing a component mounting-side surface of a board handled in the screen printing apparatus.

Next, the plane view of the component mounting-side surface in the board 202 handled in such a screen printing apparatus 101 is shown in FIG. 17.

Herein, the board 202 is a board to form an electronic circuit with a plurality of electronic components mounted on both surfaces, i.e., a board for so-called double-sided mounting. In the board 202 shown in FIG. 17, one surface of both the surfaces in such a board for double-sided mounting is regarded as a component mounting-side surface S, and a plurality of electronic components 101 are mounted on the component mounting-side surface S while the electronic components 101 are not yet mounted on the other surface. Also, FIG. 17 is a schematic plane view showing the component mounting-side surface S having the respective electronic components 201 mounted thereon as a top face. It is to be noted that although not shown in FIG. 17, the surface on the side opposed to the component mounting-side surface S in the board 202 (i.e., the back surface of the component mounting-side surface S) ends up to have the respective electronic components 1 mounted thereon, and for this mounting, the surface is deemed as a working-side surface to which a solder paste is fed by the screen printing apparatus 101.

As shown in FIG. 17, the board 202 is in an almost square shape, and has a plurality of slit-like-hole portions 209 formed along its outer peripheral outline and through the board 202. These slit-like-hole portions 209 are provided so that after mounting of the respective electronic components 201 is completed and an electronic circuit is formed in the board 202, an inside region surrounded with the respective slit-like-hole portions 209, which is deemed as a product portion, is cut off and separated from the outer peripheral outline portion. On the component mounting-side surface S, the inside region surrounded with the respective slit-like-hole portions 209 constitutes a component mounting region R1, whereas a region outside the respective slit-like-hole portions 209 constitutes an outer periphery region R2. Further, in order to facilitate the cutting-off operation, a plurality of slim connecting portions 212 for connecting a portion of the board 202 corresponding to the component mounting region R1 and a portion corresponding to the outer periphery region R2 are placed between the respective slit-like-hole portions 209. Therefore, by cutting off these connecting portions 212, the product portion can be separated.

Further, as shown in FIG. 17, on the component mounting-side surface S of the board 202, the electronic components 201 with a variety of shapes of many sizes are mounted in high density. Such electronic components 201 can be divided into two kinds in general. They are, for example, a chip component 201A which is a small-size electronic component 201 such as resistors and capacitors and an IC component 201B which is a chip component 201A larger than such a chip component 201A and requires relatively large mounting area in the component mounting region R1.

Further, as shown in FIG. 17, in the outer periphery regions R2 of the board 202, positioning holes 203 for positioning the loaded board 202 in the screen printing apparatus 101 are formed through the board 202. For example, in the vicinity of both right and left end portions in the outer periphery regions R2 on the lower side of the drawing, the respective positioning holes 203 are formed.

It is to be noted that in the component mounting region R1 of the board 202, there is a large region R3 where the electronic components 201 are not mounted. The region R3 is a region on which the IC component 201B (or the chip component 201A in addition to the IC component 201B) is selectively mounted and therefore the IC component 201B can be mounted according to the type and specification of the board 202. The board 202 shown in FIG. 17 is the one in which the IC component 201B is not selectively mounted on the region R3.

It is to be noted that the board 202 for use in the second embodiment is such a board as to be mounted on video cameras and digital cameras, and since the board is incorporated in electronic equipment which is downsized while keeping high performance, a plurality of electronic components are mounted on both sides of the board in highly integrated state. Therefore, the screen printing apparatus 101 in the second embodiment is an apparatus for printing a bonding material on the working-side surface of the board 202, on the component mounting-side surface S of which a variety of electronic components 201 are mounted in higher density.

Next, a detailed description is given of the board retaining device 250 included in the screen printing apparatus 101. First, the schematic cross sectional view schematically showing the board retaining device 250 in the state of retaining the board 202 is shown in FIG. 18. As shown in FIG. 18, the board retaining device 250 includes a board retaining block 221 for supporting the board 202 while sucking the supported board 202 to retain its supported position, and a vacuum suction unit 222 (exemplifying the suction unit). The board retaining block 221 retains the board 202 by bringing its upper surface into partial contact with the component mounting-side surface S of the board 202 which is located so that the component mounting-side surface S faces down in the drawing while the working-side surface T faces up in the drawing.

Figure 19:
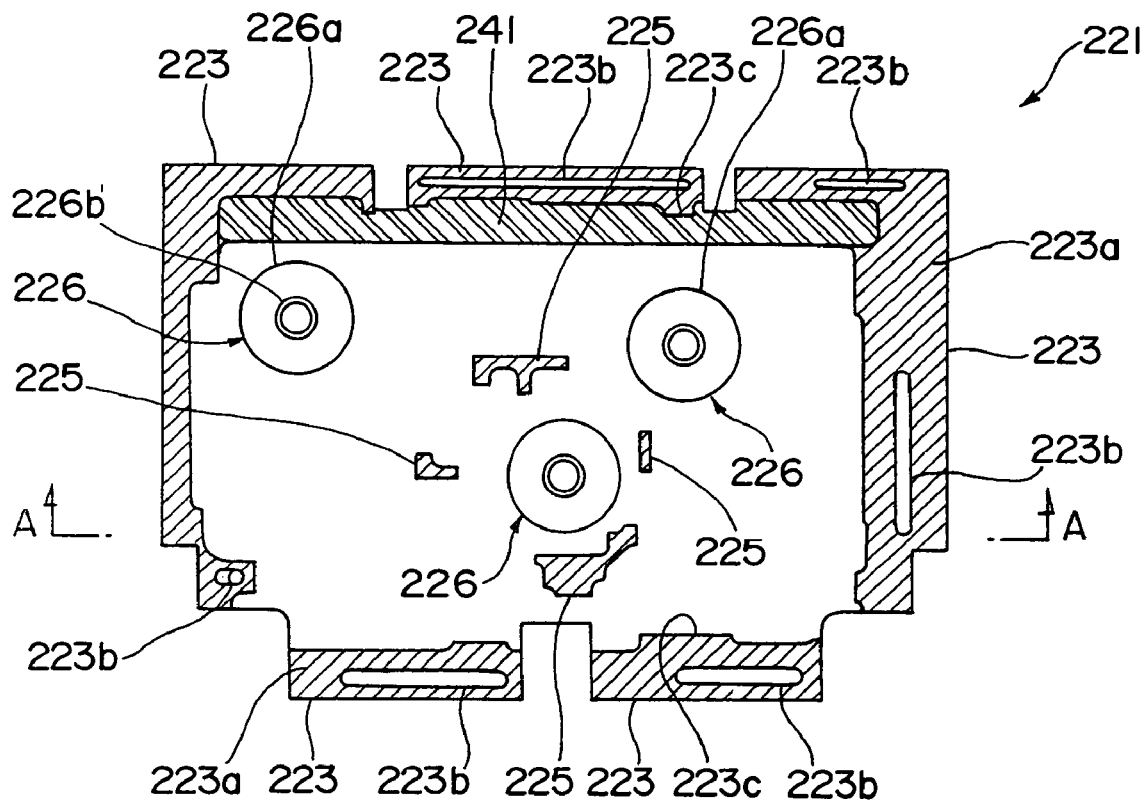
FIG. 19 is a plane view showing the upper surface of a board retaining block included in the board retaining device of FIG. 18.
Figure 20:
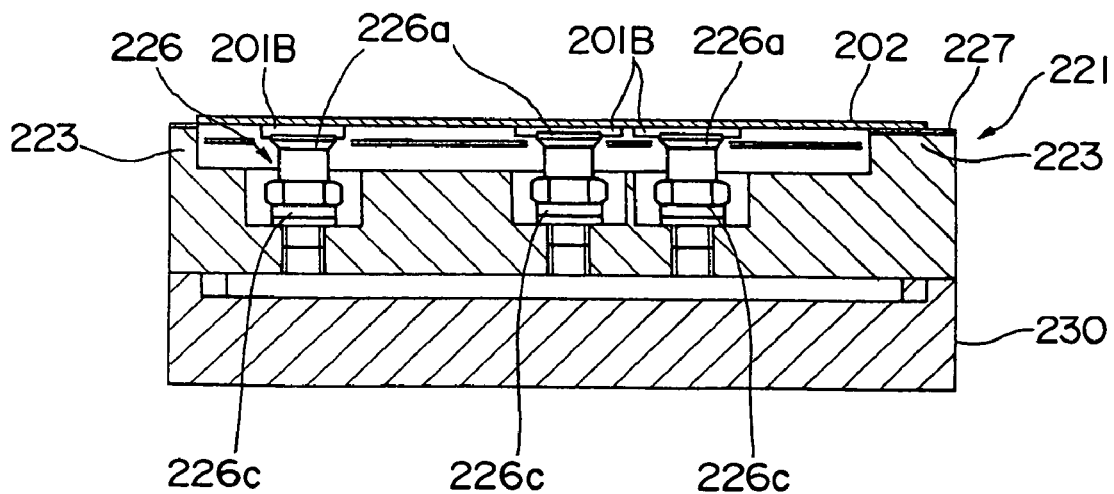
FIG. 20 is a cross sectional view taken along the line A-A in the board retaining block of FIG. 19.

Herein, the plane view of the board retaining block 221 is shown in FIG. 19, and the cross sectional view of FIG. 19 taken along the line A-A is shown in FIG. 20. It is to be noted that FIG. 19 is a view in which the board 202 is transparent, whereas FIG. 20 shows the board 202 without making it transparent so as to illustrate the support state of the board 202 by the board retaining block 221.

As shown in FIG. 18 to FIG. 20, the board retaining block 221 is in an almost rectangular parallelepiped shape, and its upper surface has a recess portion 224 surrounded with an edge portion. A space inside the recess portion 224 exemplifies the contact avoiding space for avoiding the contact between the respective electronic components 201 mounted on the board 202 and the board retaining block 221. Further, as shown in FIG. 19, the board retaining block 221 has a plurality of board edge retaining portions 223 exemplifying the board edge retaining member, which are portions forming the outer peripheral end portion of the recess portion on the periphery portion on the upper surface of the board retaining block 221 and which retains the board 202 upon contact with the board 202. In the respective board edge retaining portions 223, their upper surfaces are formed as support faces 223a which are congruent with the disposition of the outer periphery regions R2 on the component mounting-side surface S of the board 202. By disposing the board 202 on the upper surface of the board retaining block 221 with the component mounting-side surface S facing down, it becomes possible to reliably bring the respective support faces 223a into contact with the outer periphery regions R2.

For example, in the case where the outer periphery regions R2 are formed to be almost in the same height as in the case of the second embodiment, the respective support faces 223a are also formed to be in the same height to each other. By such disposition of the respective board edge retaining portions 223, the respective board edge retaining portions 223 does not come into contact with the respective electronic components 201 mounted on the board 202 even in the state that the board 202 is supported by the board retaining block 221. It is to be noted that the board retaining block 221 has a size of, for example, 100 mm×70 mm×30 mm high.

Further, the board edge retaining portions 223 are not formed in the portions corresponding to the respective positioning holes 203 placed on the board 202. This is for preventing interference between unshown positioning pins and the respective board edge retaining portions 223 since alignment of the board 202 and the board retaining device 250 is performed by inserting the positioning pins or the like into the respective positioning holes 203. In the board retaining block 221 shown in FIG. 19, the portion where the interference is prevented is shown in the lower left side and the lower right side in the drawing.

It is to be noted that although in the second embodiment, a description is given of the case where a plurality of the board edge retaining portions 223 are formed in the board retaining block 221, the present invention is not limited thereto. Instead of such a case, it is also acceptable to provide one board support portion formed so as to integrally continue along the upper edge portion of the board retaining block 221 for example. This is because if the portions equivalent to the outer periphery regions R2 of the board 202 can be reliably supported, then a function as the board support portion can be secured.

Further, as shown in FIG. 19, on the respective support faces 223a, suction holes 223b are formed for sucking the outer periphery regions R2 of the board 202 in the contact state. The aperture on the support faces 223a in the respective suction holes 223b is formed into an almost groove-shaped hole extending along the longitudinal direction of each of the support faces 223a so that their suction areas are secured.

It is to be noted that while the board edge retaining portion 223 placed on the left end shown in FIG. 19 is to support the right end portion of the board 202 shown in FIG. 17, almost no outer periphery regions R2 are placed on the right end portion so that the support face 223a of the board edge retaining portion 223 on the left end is formed to have a small width compared to other support faces 223a. In this case, it is sometimes difficult to form the suction holes 223b on the support faces 223a, though this difficulty can be surmounted by forming the suction holes 223b only in the regions capable of forming the suction holes 223b in the vicinity of the lower end of the support faces 223a as shown in FIG. 19.

Further, the board retaining block 221 has auxiliary support portions 225 exemplifying the board support member (or exemplifying the support auxiliary dedicated member) for offering further auxiliary support to the board 202 which is in the state of being fixed to the inside of the recess portion 224 and supported by the respective board edge retaining portions 223. More specifically, there are provided the auxiliary support portions 225 which support non-mounting regions R4 of the respective electronic components 201 (i.e., the regions free from mounting of the electronic components 1) located in the vicinity of the near center of the component mounting-side surface S of the board 202 by coming into contact with the non-mounting regions R4. In the board 202 shown in FIG. 17, for example, four non-mounting regions R4 (the hatched regions in FIG. 17) are located in the vicinity of the periphery of the IC components 201B which are mounted in the vicinity of the near center of the component mounting region R1, and four auxiliary support portion 225 are provided so as to be congruent with the respective non-mounting regions R4 as shown in FIG. 19. It is to be noted that the number of the auxiliary support portions 225 to be set is determined according to disposition of the respective electronic components 201 or the like on the component mounting-side surface S of the board 202, and therefore instead of providing a plurality of the auxiliary support portions 225, one auxiliary support portion 225 may be provided. It is to be noted that in the case where a plurality of the auxiliary support portions 225 are provided, the respective auxiliary support portions 225 should preferably be located at almost constant intervals. Such disposition allows the auxiliary support state in the component mounting region R1 to be almost uniform. Further, the respective auxiliary support portions 225 are formed so as not to come into contact with the respective mounted electronic components 201. Disposition of the respective auxiliary support portions 225 is determined so that their end portions are positioned away by a predetermined distance, e.g., about 0.5 mm, from the end portions of the electronic components 201 which are located in the vicinity of the respective auxiliary support portions 225. Such predetermined distance is kept in consideration of displacement occurred at the time of retaining the board 202 by the board retaining device 250 and mounting position displacement of the respective electronic components 201, and if such displacement occurs, such distance prevents the respective auxiliary support portions 225 from coming into contact with the electronic components 201.

Further, the board retaining block 221 has suction pad portions 226 exemplifying the component suction member (or exemplifying the suction auxiliary dedicated member) which offer further auxiliary suction to the board 202 which is in the state of being fixed to the inside of the recess portion 224 and being supported. More specifically, on the board 202 in FIG. 17, there are provided three suction pad portions 226 which separately suck the surface of the IC component 201B located so as to be surrounded with the respective non-mounting regions R4 and the surfaces of a plurality of IC components 201B located therearound so as to achieve sucking of the board 202 through these IC components 201B, and which supplement suction and retention of the respective board edge retaining portions 223 through the suction holes 223b. It is to be noted that the number of these suction pad portions 226 to be set is determined according to the disposition of the respective electronic components 201 or the number of units to be mounted on the component mounting-side surface S of the board 202, and therefore instead of providing a plurality of the suction pad portions 226, only one suction pad portion 226 may be provided. It is to be noted that in the case where a plurality of the suction pad portions 226 are provided, the respective suction pad portions 226 should preferably be located at almost constant intervals. More particularly, the electronic components 201 of the suction targets should preferably be selected so that the suction pad portions 226 can be located at almost constant intervals. Consequently, a force generated from auxiliary suction in the component mounting region R1 can be distributed almost uniformly, thereby making it possible to achieve good suction and retention state. It is to be noted that in FIG. 20, the respective auxiliary support portions 225 located in the vicinity of the suction pad portions 226 are omitted.

A description is herein given of the disposition of the respective auxiliary support portions 225 and the suction pad portions 226 in the board retaining block 221. As shown in FIG. 19, the respective suction pad portions 226 convey their suction force to the board 202 in more uniformized state, so that the respective suction pad portions 226 should preferably be located so as to be dispersed almost evenly. For example, in the case where three or more suction pad portions 226 are located, it is preferable that the respective suction pad portions 226 are not located on an almost straight line but are located so as to form a virtual triangle plane by connecting the center of the three suction pad portions 226. Such disposition makes it possible to obtain a more uniform suction force. Moreover, although the shape of the support faces of the respective auxiliary support portions 225 are determined by the shape of the non-mounting regions R4, it is preferable that the support faces have not a shape extending only in one direction but a shape extending in directions almost orthogonal to each other for more stable support. More specifically, an almost L shape as shown in FIG. 19 makes such a shape. Further, it is more preferable that at least two or more auxiliary support portions 225 having the support face in such a shape are located in the positions almost opposed to each other with respect to the suction pad portions 226. This is because adopting such disposition makes it possible to achieve more stable support.

Further, as shown in FIG. 19 and FIG. 20, each of the suction pad portions 226 has, in its upper head which comes into contact with the IC component 201B, a suction end 226a formed from a rubber material exemplifying the cushion member such as silicon rubber, and a suction body 226b which supports the suction end 226a and has a suction hole 226c formed inside. Thus, each of the suction pad portions 226 has the suction end 226a which is formed to be soft and elastic-deformable in the portion which comes into contact with the surface of the IC component 201B, by which the suction pad portions 226 can be reliably brought into contact with the surfaces of the IC components 201B to achieve reliable suction and retention. For example, due to displacement during mounting on the board 202 and the like, the IC component 201B may be mounted in the state of being slightly inclined from the surface of the board 202. Further, there may be a case where the mounting height position of the suction target face is displaced. In such a case, providing the suction end 226a allows the displacement to be absorbed by elastic deformation of the suction end 226a, thereby making it possible to perform reliable suction and retention. Further, it also serves to prevent the IC component 201B having fine structure from being damaged by the suction and retention. It is to be noted that the suction end 226a of the respective suction pad portions 226 should preferably be dimensioned to be, for example, 6 mm or more in diameter. Such dimensioning makes it possible to secure a sufficient suction force.

Further, the mounting height position of the suction target face of the respective IC components 201B mounted on the board 202 varies depending on each IC component 201B. Consequently, as shown in FIG. 20, in the respective suction pad portions 226, the suction ends 226a are placed in the state that the disposition height positions (suction end height position) of the suction ends 226a are separately adjusted so as to be congruent with the mounting height of the respective IC components 201B. Thus, the disposition height positions of the respective suction end 226a are adjusted in conformity with the IC components 201B or the suction and retention targets, which allows reliable contact and reliable suction and retention to be achieved. However, if a difference in height position of the suction target face in the respective IC components 201B is small, i.e., the difference in height position is within the range of elastic deformation of the suction end 226a, then the reliable suction and retention can be achieved by disposing the suction ends 226a at the same height position without differentiating the respective disposition height positions as described above.

Further, as shown in FIG. 20, the suction body 226c of the respective suction pad portions 226 can be fixed onto the board retaining block 221 by screwing its lower portion in a hole section or the like formed on the bottom portion of the recess portion 224 by threading. Further, by using such a fixing method, it becomes possible to easily adjust the disposition height position of the suction end 226a by rotating the suction pad portion 226.

Further, although the respective suction pad portions 226 suck and hold the respective IC components 201B so that a portion corresponding to the component mounting region R1 on the board 202 is pulled toward the suction pad portions 226, the retention height position of the board 202 in the vicinity portions of the respective suction pad portions 226 can be regulated since the respective auxiliary support portions 225 support the board 202 in the vicinity of the board edge retaining portions 223.

Further, as shown in FIG. 20, the support faces 223a of the respective board edge retaining portions 223 are coated with a cushion layer 227 formed from a rubber material exemplifying the first cushion member. For example, these cushion layers 227 may be formed to be about 0.5 mm thick with use of silicon rubber. Thus, since the cushion layer 227 is provided on the respective support faces 223a, the close contact between the respective support faces 223a and the outer periphery regions R2 of the board 202 when they come into contact with each other can be enhanced by elastic deformation of the cushion layer 227, thereby allowing more reliable contact as well as suction and retention to be achieved.

Further, the first cushion member forming such a cushion layer 227 is high in hardness than the cushion member (second cushion member) forming the suction end 226a of the respective suction pad portions 226. This is attributed to a difference of their main functional purposes, that is, the suction end 226a is required to flexibly deform so as to reliably come into close contact with the surface of the IC component 201B whereas the cushion layer 227 is required not only to deform to ensure close contact but also to support the board 202 in the close contact. Moreover, support faces 225a of the respective auxiliary support portions 225 are also covered with the cushion layer 227.

Figure 21:
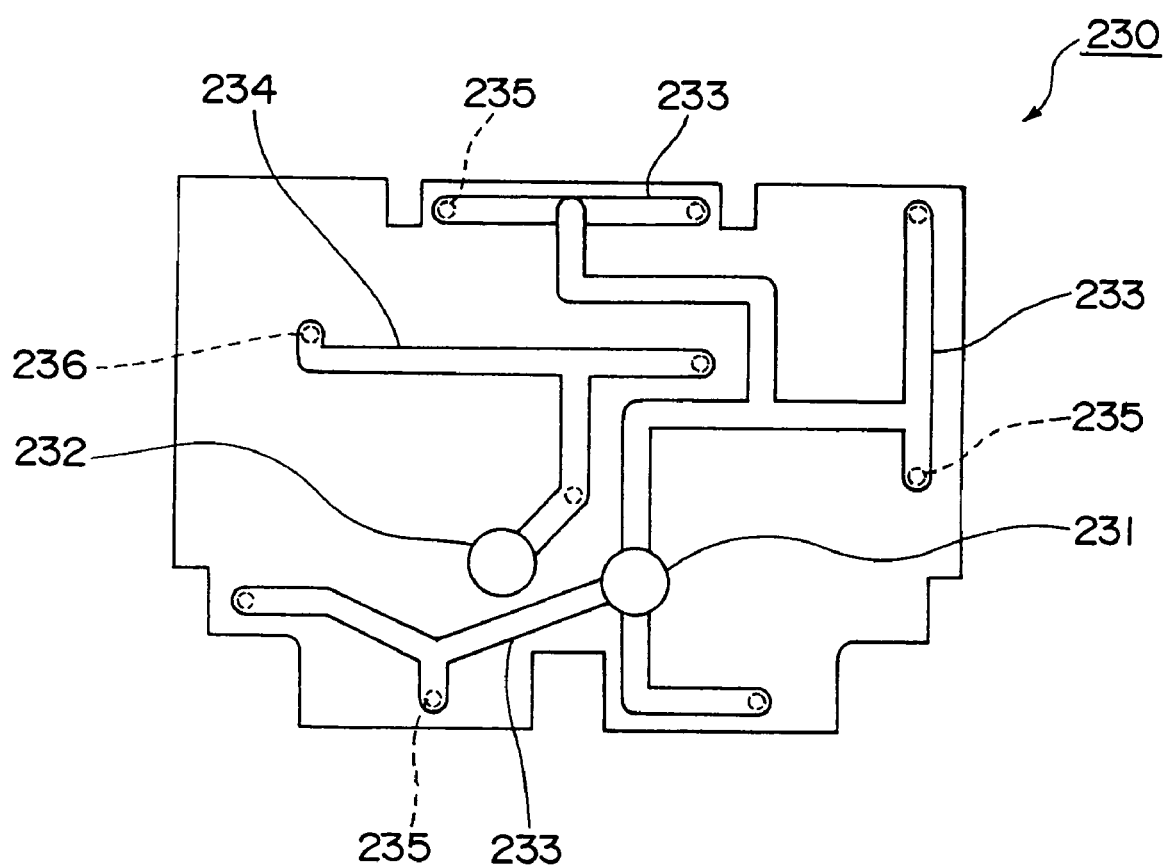
FIG. 21 is a plane view showing a bottom portion block in the board retaining block of FIG. 19.
Figure 22A:
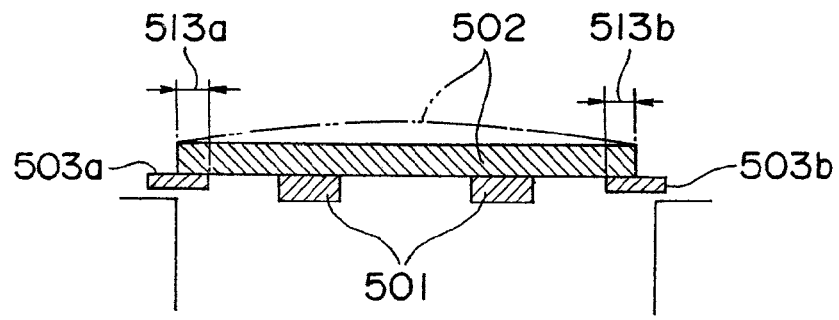
Figure 22B:
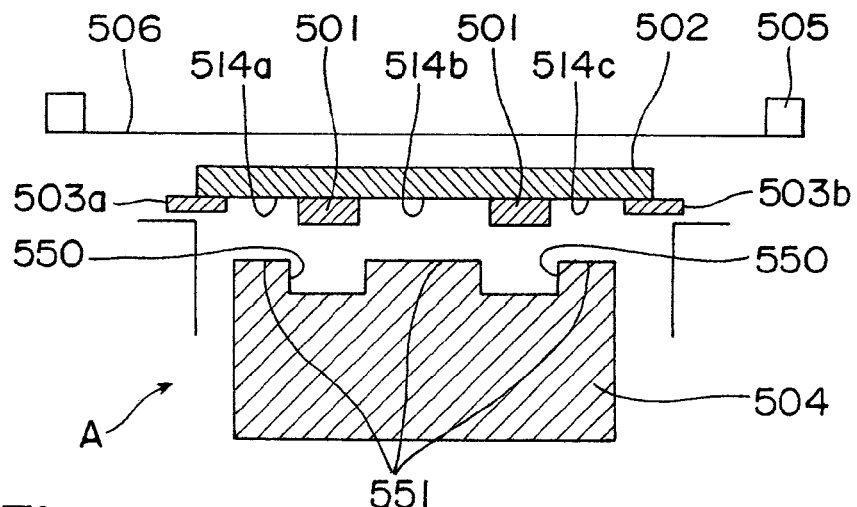
Figure 22C:
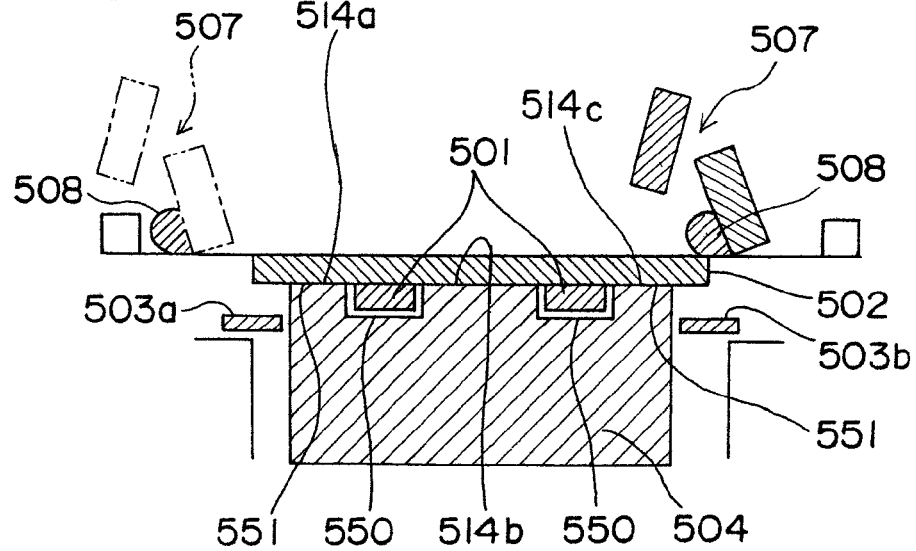
Figure 23:
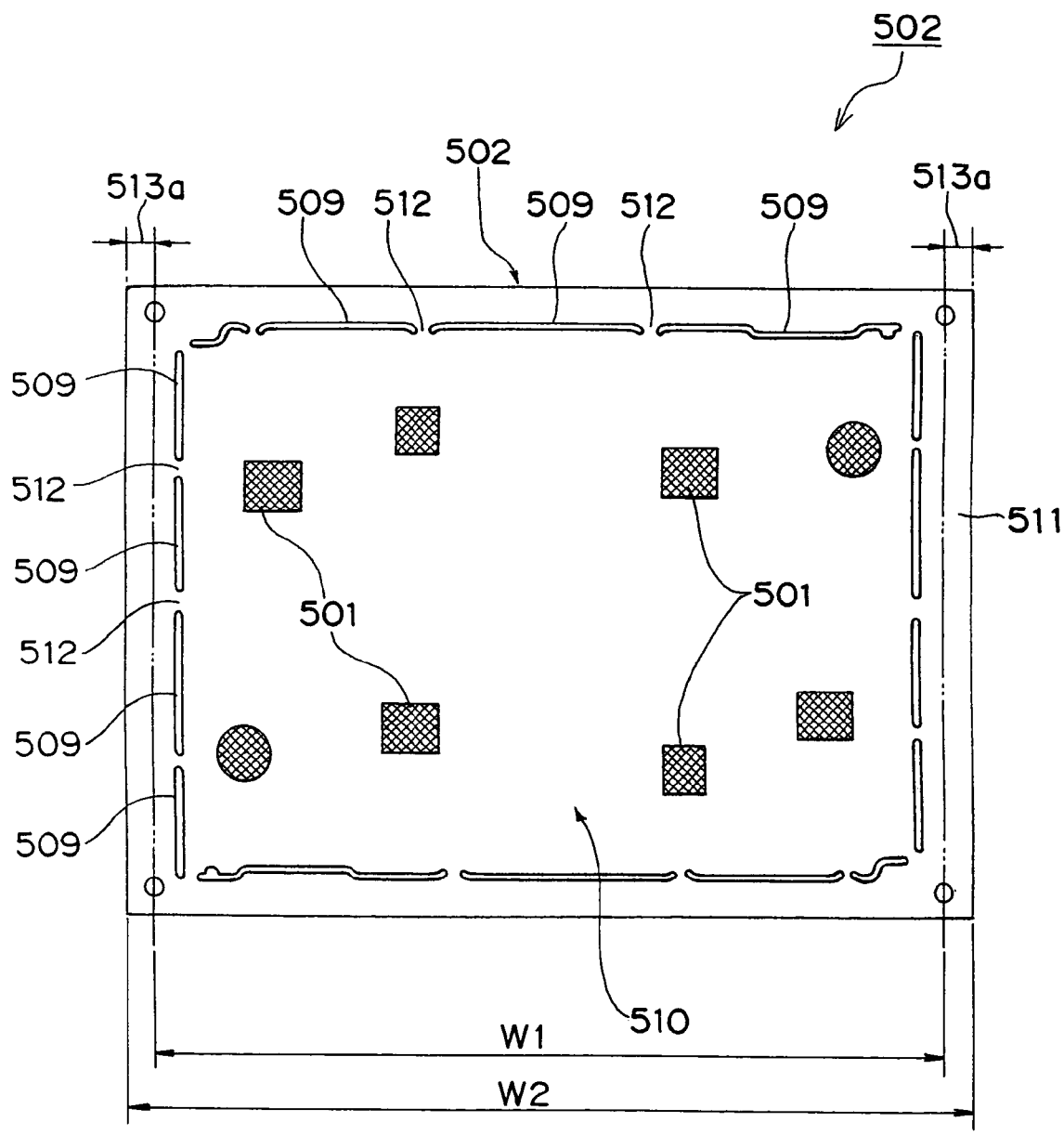
FIG. 23 is a schematic plane view showing a conventional board.
Figure 24:
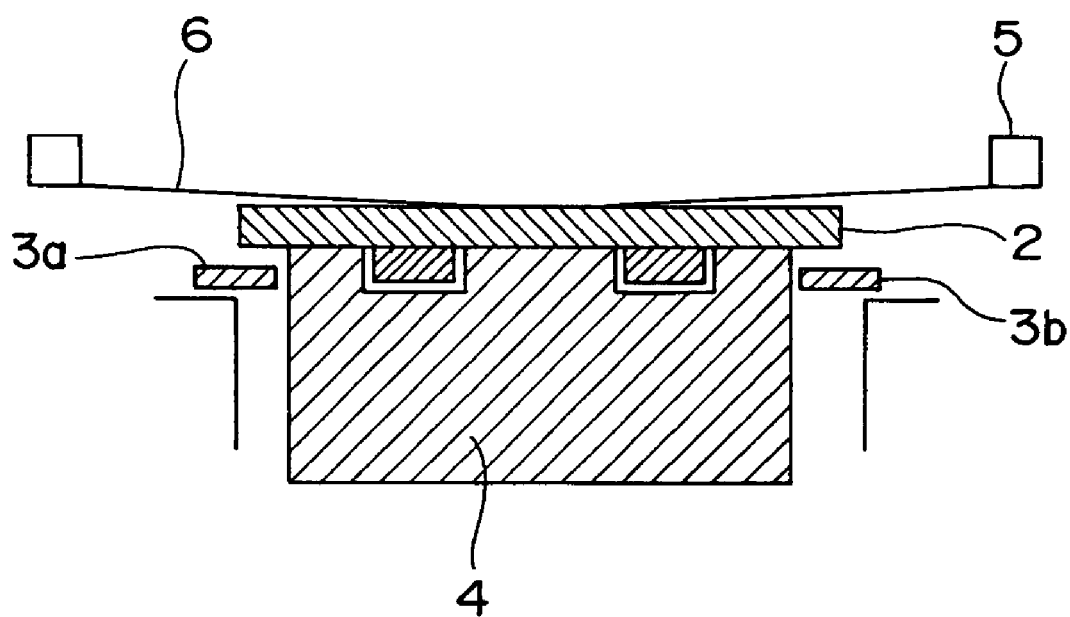
FIG. 24 is a schematic explanatory view showing the state of screen release in the conventional screen printing apparatus.

Herein, the plane view of a bottom portion block 230 of the board retaining block 221 showing suction passageways linked to the suction holes 223b provided on the support faces 223a of the respective board edge retaining portions 223 and to the suction holes 226c of the respective suction pad portions 226 is shown in FIG. 21.

As shown in FIG. 21, the board retaining block 221 has the bottom portion block 230 formed as another member, and the bottom portion block 230 linked to the upper block constitutes the board retaining block 221. Instead of this configuration, the board retaining block 221 may be formed as an integrated single member, though two-member configuration allows easy formation of suction lines described below.

On the bottom portion block 230 of the board retaining block 221, two hole portions are formed to be connected to a vacuum suction unit 222, the one located on the right side in the drawing being a support portion connecting hole portion 231 linked to the suction holes 223b possessed by the respective board edge retaining portions 223, whereas the one located on the left side in the drawing being a pad connecting hole portion 232 linked to the suction holes 226c of the respective suction pad portions 226. More particularly, inside the board retaining block 221, a suction system for the respective board edge retaining portions 223 and a suction system for the respective suction pad portions 226 are formed independently and separately.

Further, as shown in FIG. 21, on the bottom portion block 230, a support portion suction link hole 233 is formed so as to link the support portion connecting hole portion 231 to the respective suction holes 223b, and also a pad suction link hole 234 is formed so as to link the pad connecting hole portion 232 to the respective suction holes 226c. It is to be noted that although in FIG. 21, only the lateral hole portions in the support portion suction link hole 233 and the pad suction link hole 234 are illustrated, vertical holes 235, 236 are formed in the state of being linked to the respective lateral hole portions in conformity to the disposition of the respective suction holes 223b and 226c so that the support portion connecting hole portion 231 or 232 is linked to the respective suction holes 223b or 226c, by which vacuum pressure is transmitted so as to allow vacuum suction.

Further, as shown in FIG. 17, on the board 202, the respective slit-like-hole portions 209 are formed between the component mounting region R1 and the outer periphery regions R2 for the purpose of facilitating separability therebetween by cutting of. Such a structural feature causes the board 202 to have a characteristic of being susceptible to warp around the respective slit-like-hole portions 209. Accordingly, in order to cope with such a characteristic so as to achieve support of the board 202 with minimized warp, component support portions 223 have a protruding support face 223c which is partially protruding along the direction almost orthogonal to the direction along the outer periphery regions R2 of the board 202, i.e., along the direction from the outer periphery regions R2 to the component mounting region R1.

A more specific description is given with reference to FIG. 19. For example, the support face 223a of the component support portion 223 located on the upper center portion in the drawing has a protruding support face 223c protruding downward in the drawing. The protruding support face 223c supports the component mounting region R1 by going from the outer periphery regions R2 of the board 202 over the slit-like-hole portions 209 and finally coming into contact with a limited region of the component mounting region R1 in the vicinity of the slit-like-hole portions 209. It is to be noted that the limited region in the component mounting region R1 is a non-mounting region free from mounting of the electronic components 201. In the board retaining block 221 in FIG. 19, the support face 223a of the component support portion 223 located on the right side in the drawing similarly has a protruding support face 223c protruding toward the left side of the drawing, and also the support face 223a of the component support portion 223 located on the lower side of the drawing has a protruding support face 223c protruding upward in the drawing. Thus, the protruding support faces 223c are formed in the support faces 223a of the respective component support portions 223, which allows reliable support of the board 202 to be achieved while suppressing warp in a portion corresponding to the component mounting region R1 even in the case where the respective slit-like-hole portions 209 are formed on the board 202.

Further, it is desirable that the respective suction holes 223b having an almost groove-shaped aperture formed on the support faces 223a of the board edge retaining portions 223 are formed to have, for example, an aperture width of about 1 mm, and further that a cushion layer 227 having a width of at least about 1 mm is formed around the aperture. Thus, forming the aperture makes it possible to set the width of the support face 223a at a minimum necessary width, while reliably disposing the cushion layer 227 around the aperture makes it possible to ensure transmission of a suction force by the respective suction holes 223b to the board 202. It is to be noted that the width of the aperture of the respective suction holes 223b can be determined so as to be able to secure an aperture area which can offer a necessary suction force based on suction pressure. Further, the suction pressure to be adopted is, for example, vacuum pressure of −30 kPa or more, and more preferably vacuum pressure of −40 kPa or more.

A description is now given of the procedures to print and feed solder paste to the board 202 in the screen printing apparatus 101 having above-described configuration. It is to be noted that the printing and feeding operations shown below are comprehensively controlled by a control unit (unshown) included in the screen printing apparatus 101 while their operations are associated to each other.

First, in the screen printing apparatus 101 of FIG. 16, the board 202 having the respective electronic components 201 mounted on the component mounting-side surface S is fed with its back surface or the working-side surface T facing up, and is placed on the upper surface of the board retaining device 250. It is to be noted that in this disposition state, the board 202 is not in the state of being sucked by the board retaining device 250.

Then, positioning pins (unshown) possessed by the board retaining device 250 are elevated and inserted into the respective positioning holes 203 of the board 202 which is placed on the upper surface of the board retaining block 221. By insertion of the positioning pins, the board 202 in the disposition state is aligned with the board retaining block 221.

While the board retaining block 221 is set below the screen 252, the disposition position of the board 202 which is placed on the board retaining block 221 is recognized, and based on this recognition result, the screen 252 and the board 202 are aligned. After that, the board retaining block 221 (or the entire stage supporting the board retaining block 221) is elevated so as to come closer to the screen 252 which is positioned above the board retaining block 221 and in the state of being aligned. Consequently, the screen 252 is placed on the working-side surface T so as to press the entire working-side surface T of the board 202. By the disposition of the screen 252, a warp of the board 202 can be corrected if the warp is mild and in protruding shape. Alternatively, instead of straightening distortion or warp of the board 202 with use of the screen 252, a straightening member in a rod shape or a plate shape may be located on the upper surface of the board 202 to straighten the distortion or warp. By performing the following suction and retention of the board 202 after such straightening process, the flatness of the board 202 can be maintained.

Further, in the board retaining device 250, in addition to disposition of the screen 252, suction and holding of the placed board 202 are performed. More specifically, the outer periphery regions R2 on the component mounting-side surface S of the board 202 shown in FIG. 17 are placed so as to come into contact with the support faces 223a of the respective component support portions 223 of the board retaining block 221 shown in FIG. 19. In this case, the protruding support faces 223c possessed by the respective support faces 223a go over the slit-like-hole portions 209 of the board 202 and come into contact also with the component mounting region R1 in the vicinity thereof.

Further, the respective non-mounting regions R4 placed in the vicinity of the near center on the component mounting region R1 of the board 202 are brought into contact with the support faces of the respective auxiliary support portions 225 fixed in the vicinity of the near center of the recess portion 224 in the board retaining block 221 so as to be in the state of being supported by the respective auxiliary support portions 225. Further, the suction target faces of three IC components 201B mounted on the component mounting region R1 are brought into contact with the suction ends 226a of three suction pad portions 226 provided inside the recess portion 224 of the component retaining block 221. It is to be noted that in such respective contact states, each of the cushion layer 227 and the suction end 226a are elastic-deformed by a force generated by contact, so that reliable contact state is maintained.

In such contact state, vacuum pressure is transmitted by the vacuum suction unit 222 of the board retaining device 250 to the respective suction holes 223b, 226c through the respective support portion connecting hole portions 231, 232, and the suction link holes 233, 234, by which suction of the board 202 by the respective suction holes 223b and 226c is performed. Consequently, the outer periphery regions R2 of the board 202 are sucked and held by the support faces 223a of the respective board edge retaining portions 223, and the surfaces of these three IC components 201B are sucked and held by the respective suction pad portions 226. Moreover, although by suction and retention of the respective IC components 201B by the respective suction pad portions 226, the board 202 in the vicinity of the IC components 201B receives an external force going downward, the vicinity of the near center of the component mounting region R1 is supported by the respective auxiliary support portions 225 and therefore the support height position of the board 202 is regulated even with the external force, which prevents the 202 from warping downward.

Thus, in the state that the board 202 is reliably sucked and held, a squeegee (unshown) included in the printing head 251 is located on the screen 252, and is horizontally moved by the head moving unit 253 along the surface of the screen 252, by which printing and feeding of the solder paste through the screen 252 is performed. It is to be noted that in the board retaining block 221 shown in FIG. 19, the vertical direction in the drawing is the moving direction of the squeegee for printing and feeding of the solder paste.

When the squeegee is moved, the screen 252 is elevated and separated from the working-side surface of the board 202. By this separation, a printing pattern of the solder paste is formed on the working-side surface T of the board 202. Further thereafter, the suction and retention of the board 202 by the board retaining device 250 is cancelled. Then, the board 202 is discharged from the board retaining device 250.

Although in the second embodiment, a description has been given of the case where the board retaining block 221 has both the respective auxiliary support portions 225 and the suction pad portions 226 in addition to the respective board edge retaining portions 223, the second embodiment is not limited to this case. Instead of this case, for example, the board retaining block 221 may have, for example, either one of the auxiliary support portions 225 and the suction pad portions 226 in addition to the respective board edge retaining portions 223.

This is because in the case where the IC components 201B are not mounted on the component mounting-side surface S of the board 202 for example, it is preferable to have only the auxiliary support portions 225 without the suction pad portions 226 for sucking and holding the IC components 201B. However, in such a case, suction holes should preferably be formed on the auxiliary support portions 225 to provide a suction function. This is because in the case where only the auxiliary support portions 225 are provided in addition to the respective board edge retaining portions 223, it becomes possible to supplement not only the support of the board 202 but also the suction thereof.

Further, although the description has hereinabove been given of the case where the outer periphery regions R2 to be supported by the respective board edge retaining portions 223 are sufficiently formed on the board 202, the configuration of the board 202 is expected to be of great variety, and therefore enough area for the outer periphery regions R2 may not be secured. In such a case, there is the possibility that the board 202 is not fully supported by the respective board edge retaining portions 223.

Accordingly, in the case where enough area for the outer periphery regions R2 is not secured, the support of the board 202 can be supplemented by, for example, as shown in FIG. 19, forming a step support portion 241 adjacent to the board edge retaining portion 223 located on the upper side of the drawing with its support face formed one step down, and supporting a part of the component mounting region R2 of the board 202 by the support face of the step support portion 241. More specifically, in consideration of the thickness or the like of the electronic components 201 mounted on the component mounting region R2 which comes into contact with the step support portion 241, the support face is formed proportionally one step down from the support faces 223a of the board edge retaining portions 223, and further the support face is covered with a cushion member such as rubber materials, by which the support of the component mounting-side surface S can be achieved without damaging the electronic components 201.

Further, similarly in the case where enough area for the respective non-mounting regions R4 cannot be secured on the component mounting-side surface S of the board 202, the electronic components 201 mounted on the component mounting region R1 may be supported (the board 202 may be supported through the electronic components 201) by the respective auxiliary support portions 225. However, in the case where a plurality of the auxiliary support portions 225 are provided, it is preferable that not all the auxiliary support portions 225 support the electronic components 201, but a part of the auxiliary support portions 225 support the electronic components 201 and the others support the non-mounting regions R4 as much as possible. This is for decreasing the possibility to damage the electronic components 201 by the support. Further, if such support of the electronic components 201 is conducted, then it is preferable that the electronic components 201 having a higher resistance against the application of an external force are selected and supported.

Further, although in the second embodiment, a description has been given of the case where such a board retaining device 250 is included in the screen printing apparatus 101 for printing and feeding solder paste to the working-side surface T of the board 202, application of the board retaining device 250 is not limited to this case. Instead of this case, the board retaining device 250 may be included in, for example, an electronic component mounting apparatus in which after printing and feeding of solder paste to the working-side surface T of the board 202 is performed, the electronic components 201 are mounted (or placed) through the solder paste. In such an electronic component mounting apparatus, reliable retention of the board 202 can be achieved.

According to the second embodiment, the following various effects can be implemented.

First, the board retaining device 250 included in the screen printing apparatus 101 has, in addition to the respective board edge retaining portions 223 for retaining the board 202 by supporting and sucking the outer periphery regions R4 of the board 202, the respective auxiliary support portions 225 for supplementing the support of the board 202 performed by the respective board edge retaining portions 223 by supporting the respective non-mounting regions R4 located in the vicinity of the near center of the component mounting region R1 on the component mounting-side surface S of the board 202, and the suction pad portions 226 for sucking and holding the board 202 through the electronic components 201 by sucking and holding the surfaces of the electrical component 201 mounted in the vicinity of the respective auxiliary support portions 225. Therefore, it becomes possible to reliably support the component mounting-side surface S of the board 202 having the electronic components 201 mounted thereon in high density, and to retain the support position.

Particularly, in the case where the respective electronic components 201 are mounted in high density as stated above, the component mounting region R1 surrounded with the outer periphery regions R2 of the board 202 has considerably less region (i.e., non-mounting region R4) which can be supported by coming into contact with the surface of the board 202. However, in this case, the suction function is not provided to the respective auxiliary support portions 225 and only the support function by virtue of contact is provided, which makes it possible to diminish the area for the respective support faces and to accomplish the support.

The suction function which is not provided to the auxiliary support portions 225 is provided to the respective suction pad portions 226, and further the respective suction pad portions 226 suck the surfaces of the IC components 201B mounted on the component mounting region R1, by which suction of the board 202 through the respective IC components 201B can be achieved.

More particularly, the outer periphery regions R2 free from mounting of the electronic components 201 are reliably supported by respective board edge retaining portions 223 for execution of suction and retention, while a deficiency in support and suction by the respective board edge retaining portions 223 is covered by the support function and suction function which are separately provided to the respective auxiliary support portions 225 and the suction pad portions 226, thereby allowing reliable retention of the board to be achieved.

Therefore, the board 202, both sides of which have the electronic components 201 mounted thereon in high density can be reliably sucked and held with its component mounting-side surface S serving as the support-side surface, so that in the screen printing apparatus 101, reliable and precise screen printing can be performed on the working-side surface T of the board 202.

Further, the support height position of the support faces of the respective auxiliary support portions 225 are almost equal to the support height position of the respective board edge retaining portions 223, which makes it possible to support the board 202 while keeping it in an almost horizontal posture without warping the board 202.

Further, the suction support height of the electronic components 201 by the respective suction pad portions 226 can be regulated so as to be the height position which allows the board 202 to keep an almost horizontal posture through support of the board 202 by the auxiliary support portions 225 located in the vicinity of the components.

Further, since the cushion layer 227 is provided to the support faces 223a of the respective board edge retaining portions 223, the respective support faces 223a can be brought into close contact with the outer periphery regions R2 through the respective cushion layers 227, making it possible to further enhance the suction effect by the respective suction holes 223b.

Further, in the suction pad portions 226, the suction end 226a which is brought into direct contact with the surface of the IC component 201B is formed from an elastic-deformable cushion member such as rubber materials, which allows more reliable suction and retention of the surface of the IC component 201B in the contact state. Particularly, the suction pad portions 226 are required to have not a support function but a reliable suction function, so that by using a cushion member lower in hardness than the cushion member forming the cushion layer 227, the function can be effectively implemented.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2004-061772 filed on Mar. 5, 2004 including specification, drawing and claims are incorporated herein by reference in its entirety.

The invention claimed is:

1. A printing apparatus for a bonding material, in which a board is to be supported from a component mounting-side surface on which a plurality of components are mounted, and a bonding material of components is printed on a working-side surface of the board, the working side-surface and the component mounting-side surface being opposite surfaces of the board, comprising:

a board transporting unit for supporting, in a releasable manner, at least an edge portion on the component mounting-side surface of the board and transporting the board in a state of being supported to a printing processing region;

a board retaining device capable of holding the board by suction in a region including at least the edge portion on the component mounting-side surface of the board upon being released from the board transporting unit so as to retain a supported posture of the board;

a plurality of support transfer members for supporting the component mounting-side surface of the board, the support transfer members being arranged to support the board released from the board transporting unit, wherein the board is to be transferred from the support transfer members to the board retaining device; and a bonding material printing unit for printing the bonding material on the working-side surface of the board in a state in which the supported posture is retained by the board retaining device, wherein the bonding material printing unit comprises a screen which is adopted to be placed on the working-side surface of the board and which has a plate surface portion congruent with a printing position of the bonding material on the working-side surface, a printing unit for printing the bonding material on the working-side surface through the plate surface portion by feeding the bonding material while moving along the screen placed on the working-side surface, and a screen retaining device placed adjacent to the board retaining device and being arranged to bring the plate surface portion into close contact with the working-side surface by sucking and holding a vicinity of a periphery of the plate surface portion on a board-side surface of the screen placed on the working-side surface of the board, wherein the bonding material printing unit is arranged to print the bonding material in a state in which the plate surface portion of the screen is in close contact with the working-side surface of the board by the screen retaining device.

2. The printing apparatus for a bonding material as defined in claim 1, wherein the board transporting unit comprises:
- a pair of transportation support members for supporting the edge portion of the board, wherein the edge portion comprises edge portions at opposite ends of the component mounting-side surface of the board; and
- a support member moving unit for moving the pair of the transportation support members forward and backward between a support position for supporting the board and a support release position for releasing the support of the board, the support member moving unit being operable to position the transportation support members at the support release position so as to release the support of the edge portions of the board,
- wherein the board retaining device is arranged to support a region including the edge portions released from the transportation support members.

3. The printing apparatus for a bonding material as defined in claim 1, wherein the board retaining device comprises:
- a board retaining block which is arranged to be in contact with a region including the edge portion of the board and to hold the board by suction in a state of being in contact with the board; and
- an elevating unit arranged to elevate the board retaining block so as to place the screen on the working-side surface of the board being held by suction,
- wherein the elevating unit is operable to release the board by lowering the board together with the board retaining block in a state in which the screen is sucked and held by the screen retaining device so as to separate the screen and the board.

4. A printing apparatus for a bonding material, in which a board is to be supported from a component mounting-side surface on which a plurality of components are mounted, and a bonding material of components is printed on a working-side surface of the board, the working side-surface and the component mounting-side surface being opposite surfaces of the board, comprising:
- a board transporting unit for supporting, in a releasable manner, at least an edge portion on the component mounting-side surface of the board and transporting the board in a state of being supported to a printing processing region;
- a board retaining device capable of holding the board by suction in a region including at least the edge portion on the component mounting-side surface of the board upon being released from the board transporting unit so as to retain a supported posture of the board;
- a plurality of support transfer members for supporting the component mounting-side surface of the board, the support transfer members being arranged to support the board released from the board transporting unit, wherein the board is to be transferred from the support transfer members to the board retaining device; and
- a bonding material printing unit for printing the bonding material on the working-side surface of the board in a state in which the supported posture is retained by the board retaining device wherein the board retaining device comprises
- a board retaining block including a board edge retaining member which has a support face for supporting the edge portion by coming into contact with the edge portion on the component mounting-side surface of the board, and which has a suction hole formed on the support face for sucking the edge portion in the contact state so as to retain the board by supporting and sucking the edge portion, the board retaining block forming a contact avoiding space mostly surrounded with the board edge support member so as to avoid contact with the component mounting-side surface and respective components mounted on the component mounting-side surface,
- a board support member fixed on the board retaining block in the contact avoiding space for supporting a non-mounting region by coming into contact with the non-mounting region of the respective components in a vicinity of a near center of the component mounting-side surface,
- a component suction member fixed on the board retaining block in a vicinity of the board support member in the contact avoiding space for sucking surfaces of the components mounted on the component mounting-side surface, and
- a suction unit connected so as to communicate with the suction hole of the board edge retaining member and the component suction member for performing sucking for respective sucking operations,
- wherein the component suction member comprises a plurality of component suction members for separately sucking a plurality of the components mounted on the component mounting-side surface, each component suction member having a suction end, and
- in the respective component suction members, height positions of the suction ends are determined according to height positions of suction target faces of the components to be sucked.

5. The printing apparatus for a bonding material as defined in claim 4, wherein the board support member is a support auxiliary dedicated member arranged to support the non-mounting region so as to supplement a function to support the board by the board edge retaining member, and the component suction members are suction auxiliary dedicated members which suck the components so as to supplement a function to suck the board by the board edge retaining member.

6. The printing apparatus for a bonding material as defined in claim 5, wherein the board support member is arranged to support the non-mounting region so as to regulate a height position to retain the components by the component suction members.

7. The printing apparatus for a bonding material as defined in claim 4, wherein the support face of the board edge retaining member has a first cushion member, and the suction end of each component suction member has a second cushion member lower in hardness than the first cushion member.

8. The printing apparatus for a bonding material as defined in claim 7, wherein each component suction member is a suction pad portion having, as the second cushion member, the suction end formed from a rubber material which can be elastic-deformed by contact with the components in response to mounting position displacement of the components on the suction target face.

9. A printing apparatus for a bonding material, in which a board is to be supported from a component mounting-side surface on which a plurality of components are mounted, and a bonding material of components is printed on a working-side surface of the board, the working side-surface and the component mounting-side surface being opposite surfaces of the board, comprising:
- a board transporting unit for supporting, in a releasable manner, at least an edge portion on the component mounting-side surface of the board and transporting the board in a state of being supported to a printing processing region;

a board retaining device capable of holding the board by suction in a region including at least the edge portion on the component mounting-side surface of the board upon being released from the board transporting unit so as to retain a supported posture of the board;

a plurality of support transfer members for supporting the component mounting-side surface of the board, the support transfer members being arranged to support the board released from the board transporting unit, wherein the board is to be transferred from the support transfer members to the board retaining device; and a bonding material printing unit for printing the bonding material on the working-side surface of the board in a state in which the supported posture is retained by the board retaining device wherein the board retaining device comprises a board retaining block including a board edge retaining member which has a support face for supporting the edge portion by coming into contact with the edge portion on the component mounting-side surface of the board, and which has a suction hole formed on the support face for sucking the edge portion in the contact state so as to retain the board by supporting and sucking the edge portion, the board retaining block forming a contact avoiding space mostly surrounded with the board edge support member so as to avoid contact with the component mounting-side surface and respective components mounted on the component mounting-side surface, a board support member fixed on the board retaining block in the contact avoiding space for supporting a non-mounting region by coming into contact with the non-mounting region of the respective components in a vicinity of a near center of the component mounting-side surface, a component suction member fixed on the board retaining block in a vicinity of the board support member in the contact avoiding space for sucking surfaces of the components mounted on the component mounting-side surface, and a suction unit connected so as to communicate with the suction hole of the board edge retaining member and the component suction member for performing sucking for respective sucking operations, wherein the suction hole of the board edge retaining member has a groove-shaped aperture formed along the edge portion.

10. The printing apparatus for a bonding material as defined in claim 9, wherein the board support member is a support auxiliary dedicated member arranged to support the non-mounting region so as to supplement a function to support the board by the board edge retaining member, and the component suction member is a suction auxiliary dedicated member which sucks the components so as to supplement a function to suck the board by the board edge retaining member.

11. The printing apparatus for a bonding material as defined in claim 10, wherein the board support member is arranged to support the non-mounting region so as to regulate a height position to retain the components by the component suction member.

12. The printing apparatus for a bonding material as defined in claim 9, wherein the support face of the board edge retaining member has a first cushion member, and a suction end of the component suction member has a second cushion member lower in hardness than the first cushion member.

13. A printing apparatus for a bonding material, in which a board is to be supported from a component mounting-side surface on which a plurality of components are mounted, and a bonding material of components is printed on a working-side surface of the board, the working side-surface and the component mounting-side surface being opposite surfaces of the board, comprising:

a board transporting unit for supporting, in a releasable manner, at least an edge portion on the component mounting-side surface of the board and transporting the board in a state of being supported to a printing processing region;

a board retaining device capable of holding the board by suction in a region including at least the edge portion on the component mounting-side surface of the board upon being released from the board transporting unit so as to retain a supported posture of the board;

a plurality of support transfer members for supporting the component mounting-side surface of the board, the support transfer members being arranged to support the board released from the board transporting unit, wherein the board is to be transferred from the support transfer members to the board retaining device; and a bonding material printing unit for printing the bonding material on the working-side surface of the board in a state in which the supported posture is retained by the board retaining device wherein the board retaining device comprises a board retaining block including a board edge retaining member which has a support face for supporting the edge portion by coming into contact with the edge portion on the component mounting-side surface of the board, and which has a suction hole formed on the support face for sucking the edge portion in the contact state so as to retain the board by supporting and sucking the edge portion, the board retaining block forming a contact avoiding space mostly surrounded with the board edge support member so as to avoid contact with the component mounting-side surface and respective components mounted on the component mounting-side surface, a board support member fixed on the board retaining block in the contact avoiding space for supporting a non-mounting region by coming into contact with the non-mounting region of the respective components in a vicinity of a near center of the component mounting-side surface, a component suction member fixed on the board retaining block in a vicinity of the board support member in the contact avoiding space for sucking surfaces of the components mounted on the component mounting-side surface, and a suction unit connected so as to communicate with the suction hole of the board edge retaining member and the component suction member for performing sucking for respective sucking operations, wherein in the board edge retaining member, the support face has a protruding support face which partially protrudes in a direction along the component mounting-side surface and also in a direction almost orthogonal to a direction along the edge portion of the board, and which is arranged to support an inside region adjacent to the edge portion on the component mounting-side surface by coming into contact with the region.

14. The printing apparatus for a bonding material as defined in claim 12, wherein the component suction member is a suction pad portion having, as the second cushion member, the suction end formed from a rubber material which can be elastic-deformed by contact with the components in response to mounting position displacement of the components on the suction target face.

15. The printing apparatus for a bonding material as defined in claim 13, wherein the board support member is a support auxiliary dedicated member arranged to support the non-mounting region so as to supplement a function to support the board by the board edge retaining member, and the component suction member is a suction auxiliary dedicated member which sucks the components so as to supplement a function to suck the board by the board edge retaining member.

16. The printing apparatus for a bonding material as defined in claim 15, wherein the board support member is arranged to support the non-mounting region so as to regulate a height position to retain the components by the component suction member.

17. The printing apparatus for a bonding material as defined in claim 13, wherein the support face of the board edge retaining member has a first cushion member, and a suction end of the component suction member has a second cushion member lower in hardness than the first cushion member.

18. The printing apparatus for a bonding material as defined in claim 17, wherein the component suction member is a suction pad portion having, as the second cushion member, the suction end formed from a rubber material which can be elastic-deformed by contact with the components in response to mounting position displacement of the components on the suction target face.

* * * * *